(12) United States Patent
Warren et al.

(10) Patent No.: US 12,710,647 B1
(45) Date of Patent: Aug. 18, 2026

(54) BIOSENSING SYSTEM FOR A VIRTUAL REALITY (VR) HEADSET WITH ADVANCED HEAT DISSIPATION

(71) Applicant: Evolve To You Corporation, Austin, TX (US)

(72) Inventors: Jonathon Warren, Austin, TX (US); Aziz Yuldashev, Austin, TX (US); David Fustino, Boston, MA (US)

(73) Assignee: Evolve To You Corporation, Austin, TX (US)

( * ) Notice: Subject to any disclaimer, the term of this patent is extended or adjusted under 35 U.S.C. 154(b) by 0 days.

(21) Appl. No.: 19/545,475

(22) Filed: Feb. 20, 2026

Related U.S. Application Data

(63) Continuation-in-part of application No. 19/073,850, filed on Mar. 7, 2025, now Pat. No. 12,578,796.

(51) Int. Cl.

| | |
|---|---|
| ***G02B 27/00*** | (2006.01) |
| ***G02B 27/01*** | (2006.01) |
| ***H05K 7/20*** | (2006.01) |

(52) U.S. Cl.

CPC ..... *G02B 27/0093* (2013.01); *G02B 27/0006* (2013.01); *G02B 27/0172* (2013.01); *G02B 27/0176* (2013.01); *H05K 7/20963* (2013.01); *H05K 7/20972* (2013.01); *G02B 2027/0169* (2013.01)

(58) Field of Classification Search

None

See application file for complete search history.

(56) References Cited

U.S. PATENT DOCUMENTS

| | | | | |
|---|---|---|---|---|
| 5,239,320 A * | 8/1993 | Allendorf | .............. | G02C 11/08 351/62 |
| 8,083,344 B2 * | 12/2011 | Blanshay | ................. | G02C 9/00 2/436 |
| 11,686,946 B2 * | 6/2023 | Boger | ................ | G02B 27/0176 359/630 |
| 2024/0381597 A1 * | 11/2024 | Kim | ........................ | G06F 1/163 |

* cited by examiner

*Primary Examiner* — Nicholas J Lee

(74) *Attorney, Agent, or Firm* — ArentFox Schiff LLP; Michael Fainberg

(57) ABSTRACT

A biosensing system for a virtual reality (VR) headset includes a front system portion suitable for housing a VR display and/or a computer system. The system includes an outer-facing lens with an integrated front vent. The system includes a venting architecture within the front system portion comprising a pair of vertically stacked airflow channels that extend from a lower plenum to the front vent. The lower plenum is proximate to heat-generating electronics comprising at least the VR display. The system includes a forward-facing thermally conductive member that forms at least part of an exterior enclosure of the front system portion and is thermally coupled to the heat-generating electronics and exposed to airflow within the stacked airflow channels. The venting architecture is configured to guide heated air from the lower plenum through the airflow channels to the front vent to dissipate heat.

20 Claims, 25 Drawing Sheets

610
608

604
602
606

206
802
804
804
802
800

1700
1702
1704
1706
1708

2106
352
2102
352
2100
2104
?
?

BIOSENSING SYSTEM FOR A VIRTUAL REALITY (VR) HEADSET WITH ADVANCED HEAT DISSIPATION

CROSS-REFERENCE TO RELATED APPLICATIONS

This application is a continuation-in-part of U.S. Non-Provisional application Ser. No. 19/073,850, filed Mar. 7, 2025, which is herein incorporated by reference.

FIELD OF TECHNOLOGY

The present disclosure relates to the field of virtual reality (VR), and, more specifically, to a biosensing system for a VR headset.

BACKGROUND

Virtual Reality (VR) headsets are immersive devices designed to give users the illusion of being transported into a three-dimensional, computer-generated environment. These headsets typically consist of a 3D display screen, lenses, sensors, and audio output, all working together to create a seamless virtual experience for the user. By wearing a VR headset, users can experience a simulated reality that is interactive and engaging, making it a powerful tool for gaming, education, and training applications. However, VR headsets have not been used extensively in the healthcare and wellness industries, particularly for the purpose of stress relief and relaxation.

SUMMARY

Besides the traditional uses of VR technology in entertainment and education applications, the immersive nature of VR headsets and their access to two major sensory organs of the human body—the eyes and ears—make them an ideal technology for healthcare and wellness applications. It is possible to develop software for VR headsets that plays soothing and relaxing imagery, videos, sounds, and music to help users relax and improve their health and wellness. Sensors (e.g., biosensors) may be utilized to capture relevant physiological and neural activity from the head reflecting the mental and physical states of a user.

However, commercially available VR headsets lack any biometric sensors, much less strategically placed biometric sensors capable of capturing the high-quality biometric signals necessary for medical, healthcare and wellness applications. These biometric signals may be fundamental in enhancing the multi-sensory (e.g., audiovisual and haptic) experiences of a particular VR application. For example, if a user is feeling stress while using a VR-based meditation application, capturing the biometric signals indicative of stress is paramount; only then can the meditation application adapt to maximize the reduction of stress (e.g., recommending a change of program based on detected emotional states). Unfortunately, conventional headsets typically have sensors primarily dedicated to tracking head orientation and position and eye tracking, and miss the integration of advanced sensors in areas such as the temples, forehead, etc., which are crucial for capturing detailed physiological and neurological data. Conventional headsets also fail to utilize a diverse set of sensors (e.g., EDA, PPG, EEG, etc.) configured to capture different types of information. The absence of these sensors in optimal locations means that conventional VR headsets are not designed to capture the best signals necessary for medical, healthcare and wellness applications. This limitation hinders the potential for adaptive VR environments that could respond dynamically to a user's emotional and physical state, thereby reducing the overall effectiveness and personalization of the VR experience.

Aspects of the present disclosure describe a biosensing system for a VR headset (referred to as biosensing VR headset when connected with the biosensing system), which addresses the shortcomings of conventional systems described previously. Unlike conventional VR headsets, a biosensing VR headset includes multiple sensors located in specific locations that, in combination, enhance the collection of biometric data from a wearer. Said sensors include, for example, at least one electroencephalography (EEG) sensor, at least one electrodermal activity (EDA) sensor, a photoplethysmography (PPG) sensor, and a temperature sensor. The construction (e.g., usage of brush electrodes, springs, etc.) and placement (e.g., orientation and location) of these sensors is meticulous and will be discussed in greater detail herein. The biosensing VR headset is optimized to work with a wide variety of VR applications. Merging the different modalities through sensor fusion, the enhanced biometric data collected using the biosensing VR headset enables VR applications such as self-regulation, nervous system regulation, peak performance, consciousness exploration, etc., to run effectively.

The above simplified summary of example aspects serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and exemplarily pointed out in the claims.

BRIEF DESCRIPTION OF THE DRAWINGS

The accompanying drawings, which are incorporated into and constitute a part of this specification, illustrate one or more example aspects of the present disclosure and, together with the detailed description, serve to explain their principles and implementations.

DETAILED DESCRIPTION

Exemplary aspects are described herein in the context of a headset with biofeedback and immersive virtual reality (VR) technology (henceforth biosensing VR headset). Those of ordinary skill in the art will realize that the following description is illustrative only and is not intended to be in any way limiting. Other aspects will readily suggest themselves to those skilled in the art having the benefit of this disclosure. Reference will now be made in detail to implementations of the example aspects as illustrated in the accompanying drawings. The same reference indicators will be used to the extent possible throughout the drawings and the following description to refer to the same or like items.

Figure 1A:
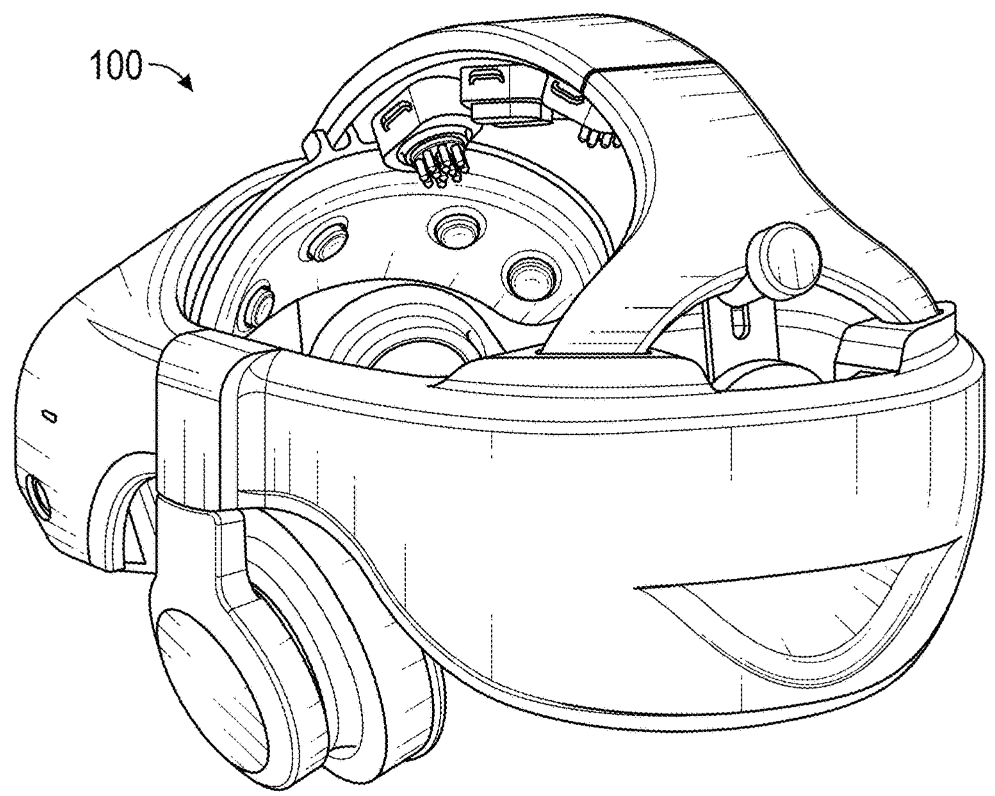
FIG. 1A is a diagram of the biosensing VR headset from a three-quarter rear-view perspective.
Figure 1B:
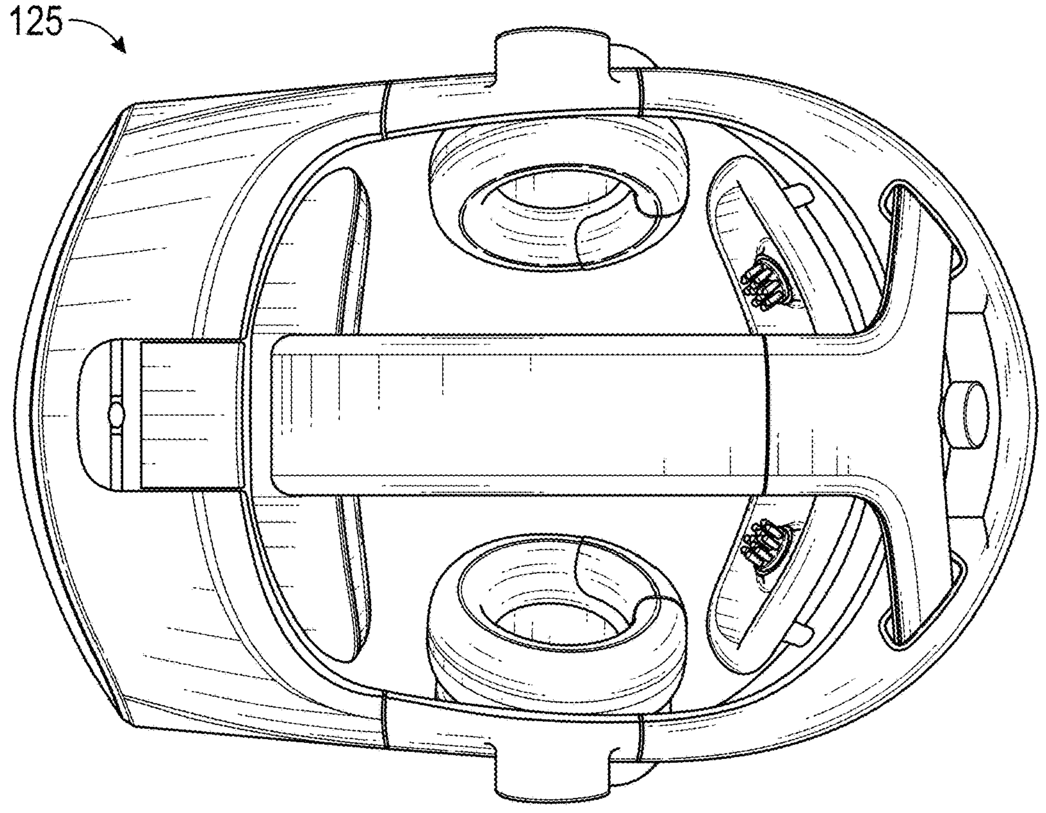
FIG. 1B is a diagram of the biosensing VR headset from a top-view perspective.
Figure 1C:
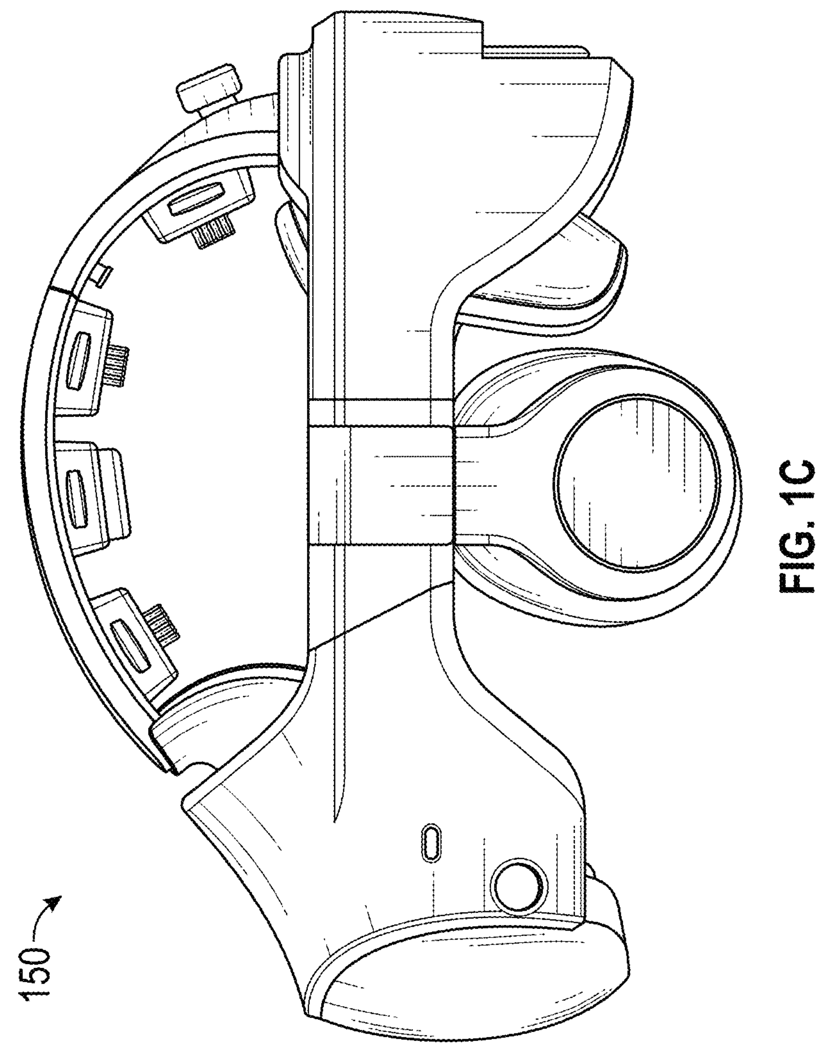
FIG. 1C is a diagram of the biosensing VR headset from a side-view perspective.

FIG. 1A is a diagram of the biosensing VR headset from a three-quarter rear-view perspective 100. FIG. 1B is a diagram of the biosensing VR headset from a top-view perspective 125. FIG. 1C is a diagram of the biosensing VR headset from a side-view perspective 150.

Figure 2:
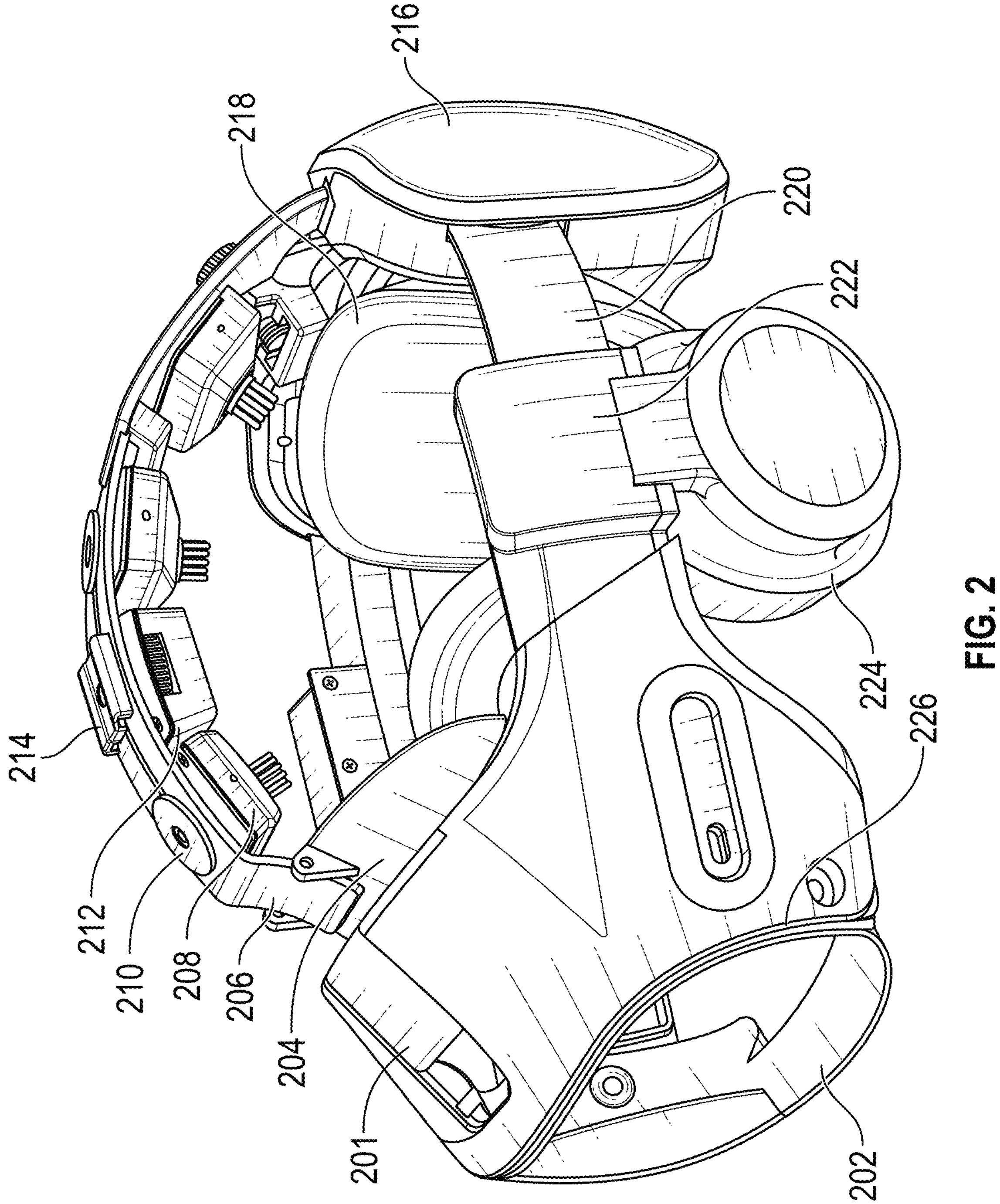
FIG. 2 is a diagram highlighting the components of the biosensing VR headset.

FIG. 2 is a diagram illustrating various components of the biosensing system 200 of a VR headset. The biosensing system 200 comprises a front system 201 having a display portion 202 for housing a VR display (shown in FIG. 3B) and an optional computer system 20 (not shown, but described in greater detail in FIG. 22), both of which may be fixedly or removably attachable to the front system 201. In one aspect, the VR display and computer system 20 may be a commercially-available VR system (such as Meta Platform Oculus or Quest VRs, HTC VIVE Pro VR, etc.), which is integrated into the front system 201. In another aspect, the VR display and computer system 20 may include a smartphone that supports VR mode (e.g., Google VR) of operation (such as an iPhone 16, a Samsung Galaxy S24, etc.), which can be removably attachable to the front system 201 via a USB C port.

In one aspect, the front system 201 may include built-in VR lenses or goggles (not shown) and optional lens adjustment/alignment mechanism (not shown). The VR lenses (shown in FIG. 3B) help focus and magnify the VR display, allowing users to view the virtual environment in a way that feels immersive and natural.

Forehead portion 204 houses a forehead pad (shown in FIG. 3A) and is attached to an overhead member 206. Overhead member 206 is a sagittal band that arches over the head of a wearer. One end of overhead member 206 is connected to forehead portion 204 and the other end is connected to rear portion 216 comprising a rear system. The length of overhead member 206 is adjustable to accommodate different head sizes. Overhead member 206 may be made of silicone and/or leather.

Overhead member 206 is further connected to three electrode modules (e.g., electrode module 208) and one bone conduction module 212. Each electrode module is fixed to overhead member 206 by a rotatable module-fixing member such as module-fixing member 210. Bone conduction module 212 is connected to overhead member 206 via module-fixing member 214. In some aspects, each module on overhead member 206 can be slid from one position on overhead member 206 to another position using the corresponding module-fixing member. For example, bone conduction module 212 can be shifted closer to electrode module 208 by sliding module-fixing member 214 closer to module-fixing member 210. This is further described in reference to FIG. 8A.

In general, from front to back, overhead member 206 includes a first electrode module, a bone conduction module, and two more electrode modules. While each of these can be shifted slightly, the order and general position of the modules is meticulously pre-selected. The positioning of modules on overhead member 206 is essential for the effective collection of biometric data due to several critical factors. Firstly, the electrode modules must maintain consistent and optimal contact with the skin to accurately measure biometric signals, such as electroencephalography (EEG) or other physiological data. Proper positioning ensures that the electrodes are placed on areas of the scalp where signal quality is highest. Secondly, correct placement minimizes noise and interference from external sources, thereby enhancing the quality of the collected data, which is particularly important for sensitive biometric measurements requiring high precision.

Additionally, the adjustable nature of overhead member 206 allows for a snug fit on different head sizes, ensuring that the modules remain in the correct position without causing discomfort. This is crucial for prolonged use, as discomfort can lead to movement, potentially disrupting data collection. Furthermore, the rotatable module-fixing members facilitate slight adjustments to maintain stability and contact even when the user moves, which is vital for consistent data collection during various activities. The bone conduction module also requires precise positioning to effectively transmit sound through the bones of the skull, ensuring that the user receives clear audio signals without interference. Lastly, proper positioning of the modules guarantees that the data collected is accurate and reliable, which is critical for applications that depend on precise biometric data, such as health monitoring or brain-computer interfaces.

The use of a single bone conduction module alongside three electrode modules in the system design is primarily driven by the distinct functional requirements of each component. Bone conduction technology relies on the transmission of sound vibrations through the bones of the skull to the inner ear, which typically requires only one well-placed module to effectively deliver audio signals without interference. This single module is sufficient to achieve clear sound transmission, as it does not require multiple contact points to function effectively. In contrast, the collection of biometric data, such as EEG signals, necessitates multiple electrode modules to capture a comprehensive and accurate representation of the brain's electrical activity. The use of three electrode modules allows for the coverage of different regions of the scalp, enhancing the spatial resolution and quality of the collected data.

The scalp is typically divided into several regions based on the International 10-20 system, which is a standardized method used to ensure consistent and reproducible measurements the location of scalp electrodes. The electrode locations follow the 10-20 system, to ensure that the distances between adjacent electrodes are either 10% or 20% of the total front-back or right-left distance of the skull (i.e. 10-20). In an exemplary aspect, overhead member 206 extends from the top of the forehead to the top of the back of the skull. The different regions of the scalp that the modules may cover.

In some aspects, the electrodes are located at Fz, F7, and F8 according to the 10-20 system. Fz (midline) captures mainly activity from the medial prefrontal cortex (mPFC), reflecting executive function, cognitive control, attention regulation, decision-making, working memory, and self-referential processing, while F7 and F8 (lateral prefrontal cortex regions) are associated with emotion regulation, language processing (F7), social cognition, inhibitory control (F8), and lateralized prefrontal asymmetry linked to affective processing reward and approach vs avoidance motivation.

An electrode is also located at Pz for parietal, which roughly captures activity from posterior cingulate cortex (PCC), key region involved in the default mode network (DMN) involved in self-referential, mind-wandering, etc. Other types of activity it may pick up are somatosensory integration, spatial processing, visuomotor coordination, attention regulation, working memory, somatosensory processing (primary somatosensory cortex), sensorimotor integration (superior parietal lobule), spatial cognition & attention (dorsal pathway), number processing/calculation (inferior parietal lobule-IPL), spatial awareness (right IPL), language & symbol processing (left IPL), multisensory integration & perception and self-consciousness (IPL & temporal-parietal junction-TPJ), tool use & action (IPL).

Electrodes are also placed at O1 and O2 sites, which capture activity from the primary and secondary visual cortices (V1-V3), primarily involved in basic visual processing, spatial awareness, motion detection, and visual attention, with O1 (left occipital) favoring right visual field processing and O2 (right occipital) favoring left visual field processing, while also contributing to alpha oscillations linked to visual suppression and attentional gating.

Rear portion 216 includes rear pad 218, which cushions the back of the head of a wearer. Rear portion 216 is connected to two side members 220 that connect system 201 with rear portion 216 on each side of the head of a wearer. Side members 220 each include a headphone fixing member 222 that is connected to headphone 224. In some aspects, headphone 224 has active noise cancellation. It should be noted that headphone fixing member 222 and headphone 224 are found on both sides of the biosensing VR headset and are referred to as members 222 and headphones 224 when referring to the components on both sides.

The biosensing VR headset further comprises RGB LED strip 226 with an optical diffuser that is mounted on the front of system 201. In some aspects, an RGB LED strip may also be mounted around headphones 224.

Figure 3A:
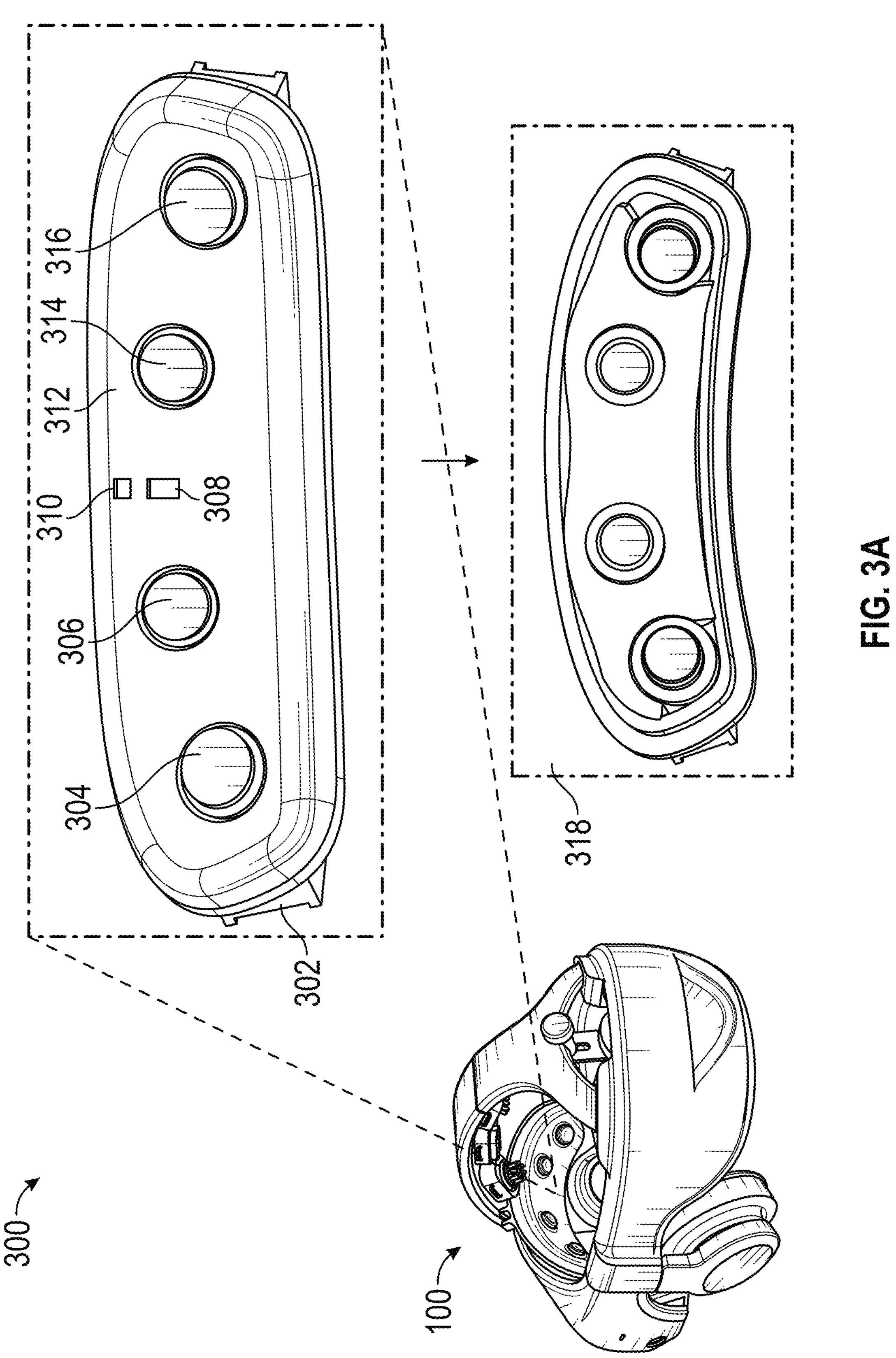
FIG. 3A is a diagram of a forehead pad of the biosensing VR headset.

FIG. 3A is a diagram 300 of a forehead pad of the biosensing VR headset. The forehead pad 302 is visible in perspective 100. As an overview, forehead pad 302 is a custom-made pad that holds the biosensing VR headset on the forehead of the wearer while equally distributing pressure.

Forehead pad 302 cushions the forehead of a wearer and includes a plurality of sensors. Sensors 304 and 316 are electroencephalography (EEG) sensors that record electrical brain activity, providing insights into any mental state such as focus, relaxation, or mental fatigue. For example, sensors 304 and 316 may include, but are not limited to, Neurotrode EEG Sensors or Protectrode Subdermal EEG Needles, and/or Datwyler SoftPulse electrodes.

Sensors 306 and 314 are electrodermal activity (EDA) sensors that capture skin conductance changes linked to sympathetic nervous system activity, indicating arousal or stress. For example, the EDA sensors may be galvanic skin response (GSR) sensors. In some aspects, the EDA sensors are the same type as the EEG sensors (e.g., Datwyler SoftPulse), but the sensor acquisition system/chipset are different. For example, for EDA, the Analog Devices MAX30009 chipset may be used and for PPG, the Analog Devices MAX30101 chipset may be used.

Sensor 310 is a temperature sensor that monitors temperature variations, often correlating with stress, relaxation, or emotional states. Body temperature variations reflect circadian rhythms, metabolic activity, thermoregulation, hormonal fluctuations, environmental influences, as well as mental states, arousal, and stress, with sympathetic activation increasing temperature and relaxation or fatigue leading to cooling.

Sensor 308 is a photoplethysmography (PPG) sensor that measures blood volume changes in microvascular tissue to track heart rate and heart rate variability (HRV), offering insights into cardiovascular health and stress levels. For example, the PPG sensor may be the Analog Devices ADPD144RI PPG Optical Sensor.

Padding 312 is a cushion (e.g., silicon cover and filled with foam material) that provides a comfortable feel when wearing the biosensing VR headset. View 318 showcases the forehead pad without padding 312. In some aspects, the foundation without padding 312 is made of plastic.

The EEG and EDA sensors may be mounted on forehead pad 302 with two approaches. In the first approach, the sensors are mounted on the foundation as shown in view 318 and may be spring loaded. Each electrode can move back/forth independently of the soft silicon front. In the second approach, each sensor is mounted on padding 312. The electrodes establish sufficient contact with the skin as padding 312 is pressed against the forehead.

The two EEG sensors and the two EDA sensors are positioned along a horizontal center line of the front cushion pad. The two EDA sensors are positioned in between the two EEG sensors, and wherein the temperature sensor and the PPG sensor are positioned in between the two EDA sensors. More specifically, the temperature sensor and the PPG sensor are aligned along a vertical line passing through a midpoint of the front portion.

The sensor placement on the forehead of the wearer is strategically designed to optimize the collection of biometric data by leveraging the anatomical and physiological characteristics of this region. Positioning the two EEG sensors along a horizontal center line of the front cushion pad allows for effective monitoring of frontal lobe activity, which is crucial for capturing cognitive and emotional processing signals. The placement of the two EDA sensors between the EEG sensors is optimal for measuring electrodermal activity, as the forehead is a region with a moderate density of sweat glands, providing reliable skin conductance data. Additionally, the alignment of the temperature sensor and the PPG sensor along a vertical line through the midpoint of the front portion ensures that these sensors can accurately measure core body temperature and blood flow characteristics, respectively. This central positioning facilitates consistent contact with the skin, enhancing the accuracy and reliability of the data collected. By integrating these sensors in a compact and centralized arrangement, the design maximizes the efficiency of data collection while maintaining user comfort and minimizing interference between different sensor types.

The exact number of sensors specified in the passage is crucial for achieving a balanced and comprehensive collection of biometric data while maintaining the device's efficiency and user comfort. By employing two EEG sensors, the design ensures adequate coverage of the frontal lobe, capturing essential cognitive and emotional signals without overcrowding the forehead area. The inclusion of two EDA sensors strategically placed between the EEG sensors allows for precise measurement of electrodermal activity, capitalizing on the forehead's high density of sweat glands. The single temperature sensor and PPG sensor, aligned vertically, provide critical physiological data such as core body temperature and blood flow characteristics, respectively. This specific sensor configuration ensures that each type of biometric data is collected effectively without redundancy, optimizing the device's functionality. Moreover, the careful selection and placement of these sensors prevent unnecessary complexity and potential discomfort, ensuring that the headset remains user-friendly and efficient in its data collection capabilities.

In some aspects, a pressure sensor is mounted on the backside of forehead pad 302. The pressure sensor may be connected to each of sensors 304, 306, 308, 310, 314, and 316. When the headset is worn, padding 312 compresses against a forehead, which presses said sensors against the pressure sensor. The processor of the biosensing VR headset (or a main printed circuit board (PCB)) continuously measures the analog signal from the pressure sensor (e.g., the amount of pressure applied) and notifies the user (e.g., using an audio indication via headphones 224 and/or RGB LED strip 226) if a pressure on each electrode is within allowed range. In some aspects, RGB LED strip 226 is made up of individual LED diodes. For example, RGB LED strip 226 may illuminate based on readings from the pressure sensor. An illumination may prompt a wearer to readjust the biosensing VR headset over a head of the wearer.

In some aspects, the biosensing VR headset further comprises Inertial Measurement Unit (IMU) sensors (e.g., accelerometers and gyroscopes). In some aspects, there are three accelerometers and three gyroscopes.

In some aspects, each electrode is connected to an active amplifier PCB with a short shielded wire to amplify sensitive microvolt brain signals without loss and thus improve signal-to-noise ratio. For example, EEG signals typically have very low amplitude and are susceptible to noise interference. The amplifier is configured to increase the amplitude of the signal. SNR is increased at the electrode level by the active system, and this higher SNR is preserved all the way to the amplifier via the shielded wires, where it can be amplified up to 24 times.

In some aspects, the biosensing VR headset further includes a bypass circuit and an Analog-to-Digital (ADC) converter. For example, one of the key parameters in EEG is impedance (electrical resistance between electrode and the skin). Lower impedances (resistance and reactance at the electrode-scalp interface) are associated with better signal quality. However, an active amplifier circuit does not allow measuring impedance. To measure impedance, a bypass circuit is implemented to shunt the amplifier and connects the electrode directly to the Analog-to-Digital converter on the main board. To measure impedance, the amplifier is thus bypassed.

In some aspects, a small PCB is mounted inside forehead pad 302. The small PCB holds the PPG sensor 308 and temperature sensor 310.

Figure 3B:
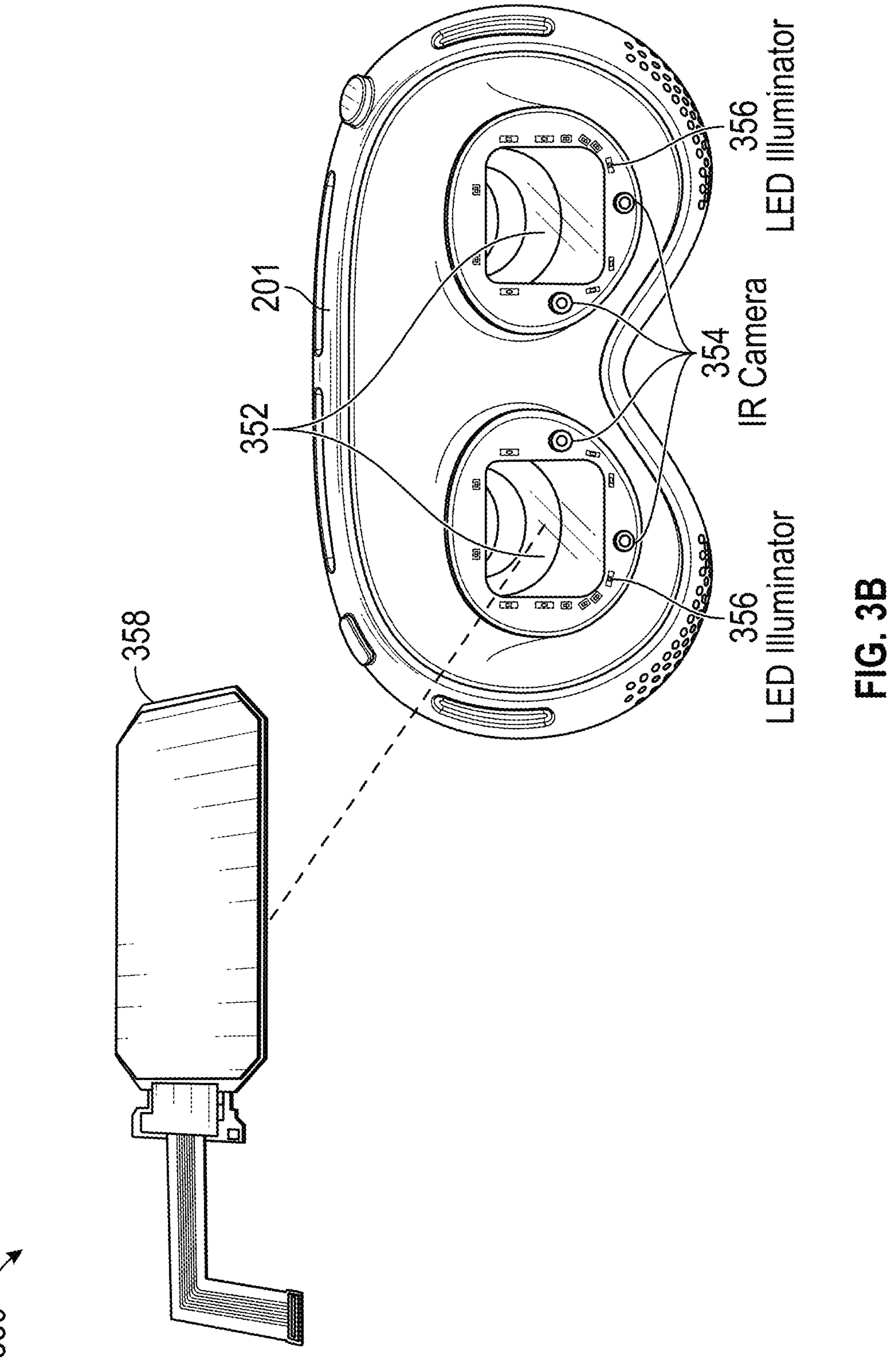
FIG. 3B is a diagram of camera sensors on the biosensing VR headset.

FIG. 3B is a diagram 350 of camera sensors of the biosensing VR headset. In some aspects, system 201 may include viewing lenses 352 through which a user views the visual content generated on display panel 358 (used interchangeably with VR display). In some aspects, display panel 358 is one of an OLED, LED, or LCD display. In some aspects, the VR display is a computer display (e.g., of a smartphone) inserted into the biosensing VR headset.

Along the perimeter of viewing lenses are one or more cameras 354 and one or more LED illuminators 356. The combination of cameras 354 and 356 enable the biosensing VR headset to monitor the eyes of the wearer. In one aspect, the front system 201 may also include one or more video cameras (shown in FIG. 3B) for monitoring the face of the user. More specifically, cameras may be used to track gaze direction, fixation, and pupil dilation to assess attention, arousal, focus, cognitive load, and the emotional responses of the user. The cameras may be also used to detect and interpret facial movements and micro-expressions, offering valuable cues about emotional and cognitive states, and for signal processing (e.g. correcting ocular artifacts from EEG signals). In general, eye tracking and pupillometry in a VR headset can capture gaze direction, fixation duration, saccades, blinks, pupil dilation, and cognitive load, providing insights into attention, arousal, and neurological or psychological states.

Figure 4A:
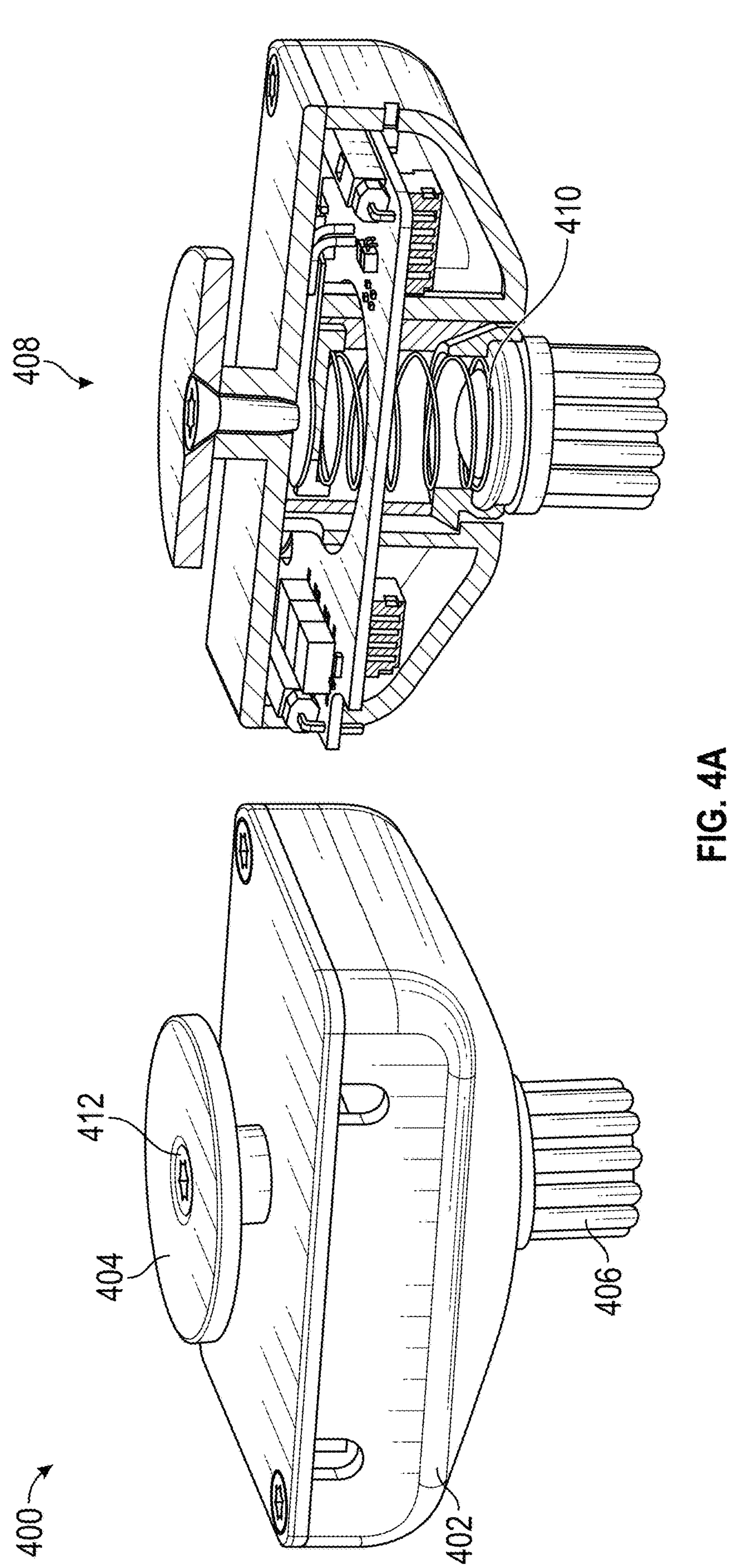
FIG. 4A is a diagram of an active electrode module of the biosensing VR headset.

FIG. 4A is a diagram 400 of an active electrode module of the biosensing VR headset. For example, diagram 400 represents electrode module 208. The electrode module has housing 402, which contains various inner sensor components. Rotatable module-fixing member 404 (corresponding to member 210) is connected to brush electrode 406 such that rotating member 404 also rotates brush electrode 406. This enables brush electrode 406 to comb through the hair of the wearer and establish contact with the skin on the head. In some aspects, a haptic motor is built into the active electrode module to control the rotation of member 404 and push hair away and to improve skin-electrode contact and therefore impedance and signal quality. In some aspects, the module may be rotated back and forth using a rotary motor instead of using a haptic vibration motor.

As shown in view 408, which showcases the inner sensor components of the active electrode module, brush electrode 406 is connected to a spring 410, which improves contact between brush electrode 406 and the surface of the head of a wearer as the spring expands or retracts to minimize a distance between brush electrode 406 and the head of a wearer.

In some aspects, module-fixing member 404 is attached to the electrode module using attaching component 412 (e.g., a screw). In some aspects, loosening the connection between module-fixing member 404 and the electrode module involves loosening (e.g., unscrewing) attaching component 412. This enables the electrode module to be repositioned along overhead member 206. An attaching component is also utilized in the bone conduction module and serves the same purpose.

It should be noted that each of the three electrode modules shown in FIG. 2 include the characteristics described in reference to FIG. 4A.

Figure 4B:
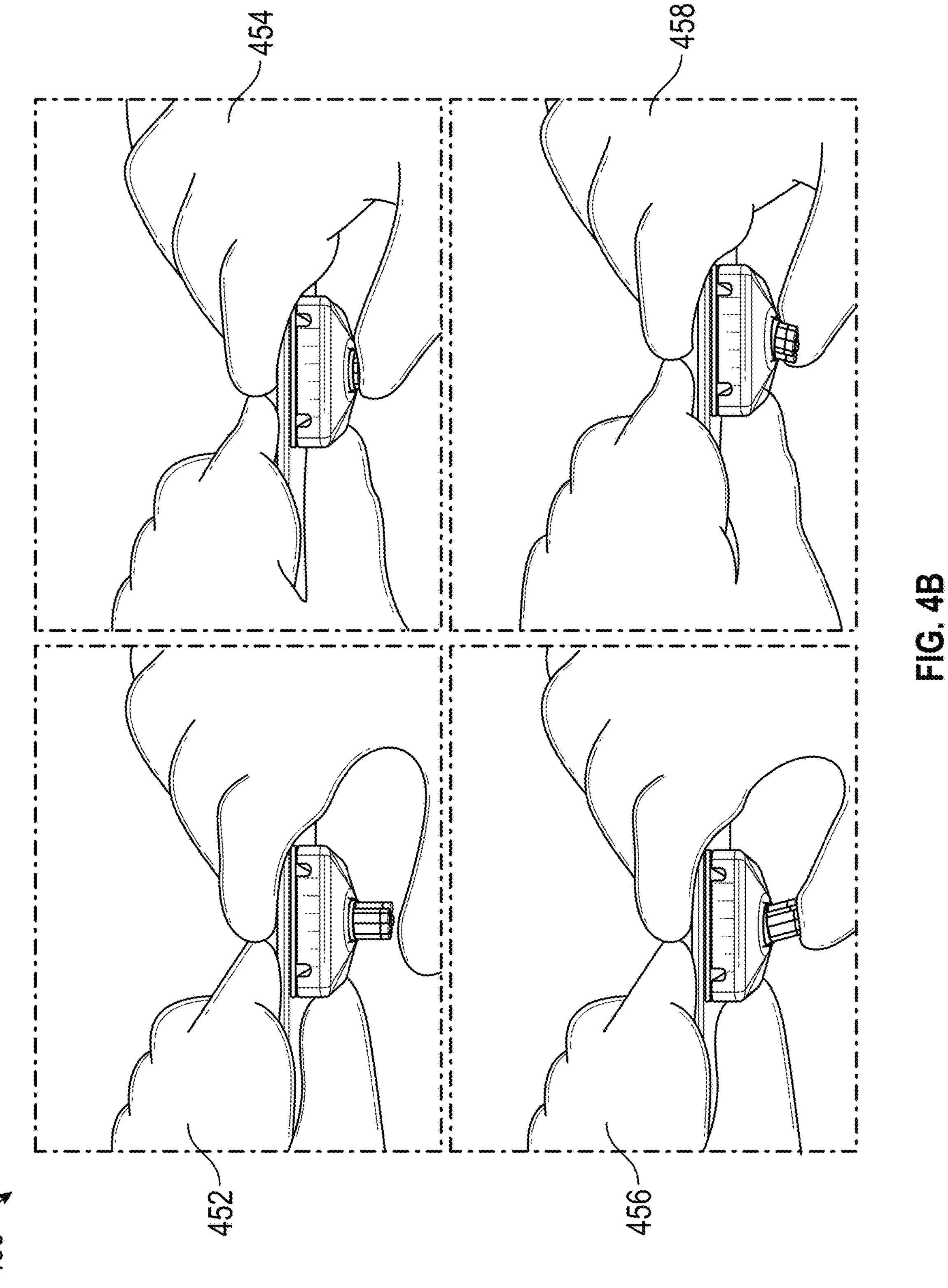
FIG. 4B is a diagram of the movement properties of the active electrode module of the biosensing VR headset.

FIG. 4B is a diagram 450 of the movement properties of the active electrode module of the biosensing VR headset. Diagram 450 comprises four views in which the active electrode module is positioned in a particular manner. View 452 is a default conformation of the active electrode module. View 454 displays a pressed conformation in which the brush electrode is pushed (i.e., spring 410 is retracted).

Spring 410 allows tilting electrodes in any direction for better skin contact. For example, in views 456 and 458, the brush electrode is tilted to enable better contact with the head of the wearer.

In some aspects, a compact round PCB is used for the active amplifier circuit. The compact round PCT sits inside spring 410, which ensures that the EEG brush electrode is closer to the amplifier circuit. In this aspect, the vibro motor is replaced with a compact micro motor (with some gears) to enable brush electrode rotation. The rectangular slot in the electrode PCB allows rotation while the entire board can move up/down the motor shaft using spring 410. In this aspect, a wider, conical spring is utilized for better tilt and to make more room for the amplifier PCB. This configuration allows for moving the entire electrode module up/down for better contact and pressure.

Figure 5:
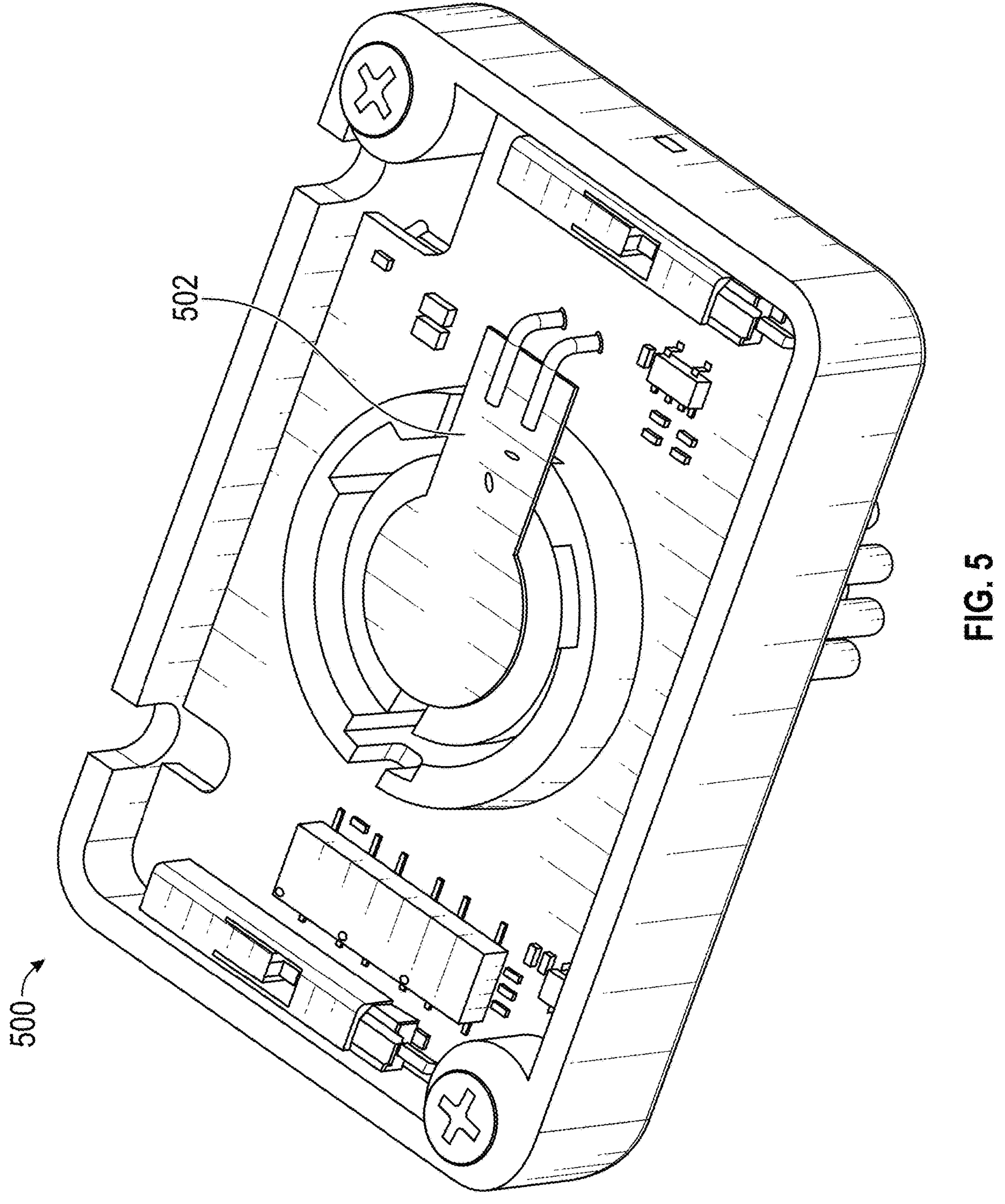
FIG. 5 is a diagram of a pressure sensor within the active electrode module.

FIG. 5 is a diagram 500 of a pressure sensor 502 within the active electrode module. In some aspects, pressure sensor 502 is mounted between spring and upper electrode lid to continuously measure pressure. Pressure sensor 502 reads how hard brush electrode 406 is pressed against the head of a wearer. In some aspects, the biosensing VR headset classifies the readings of pressure sensor 502 into different color classes. If the readings are in a good range, for example, a status LED on the biosensing VR headset (e.g., LED strip 226) or an indicator generated on display may turn green. If the readings are not in a good range, the status LED may turn red. Pressure data from each electrode is streamed into a controller (e.g., connected to a processor of the biosensing VR headset) and displayed to the wearer via display. When sufficient pressure is not applied, the wearer is prompted to adjust the individual electrode where sufficient pressure is lacking.

Figure 6:
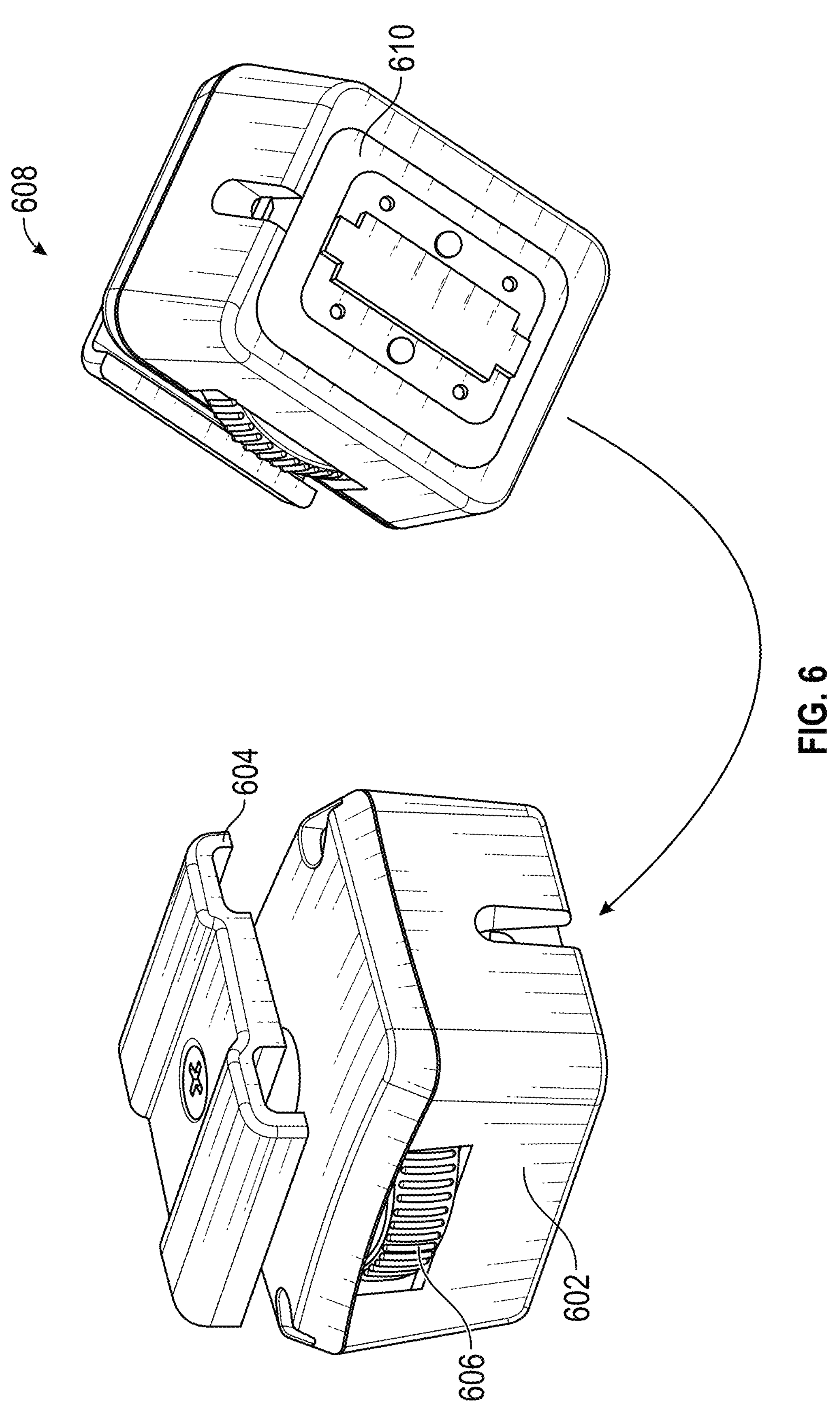
FIG. 6 is a diagram of a bone conduction module of the biosensing VR headset.
Figure 7:
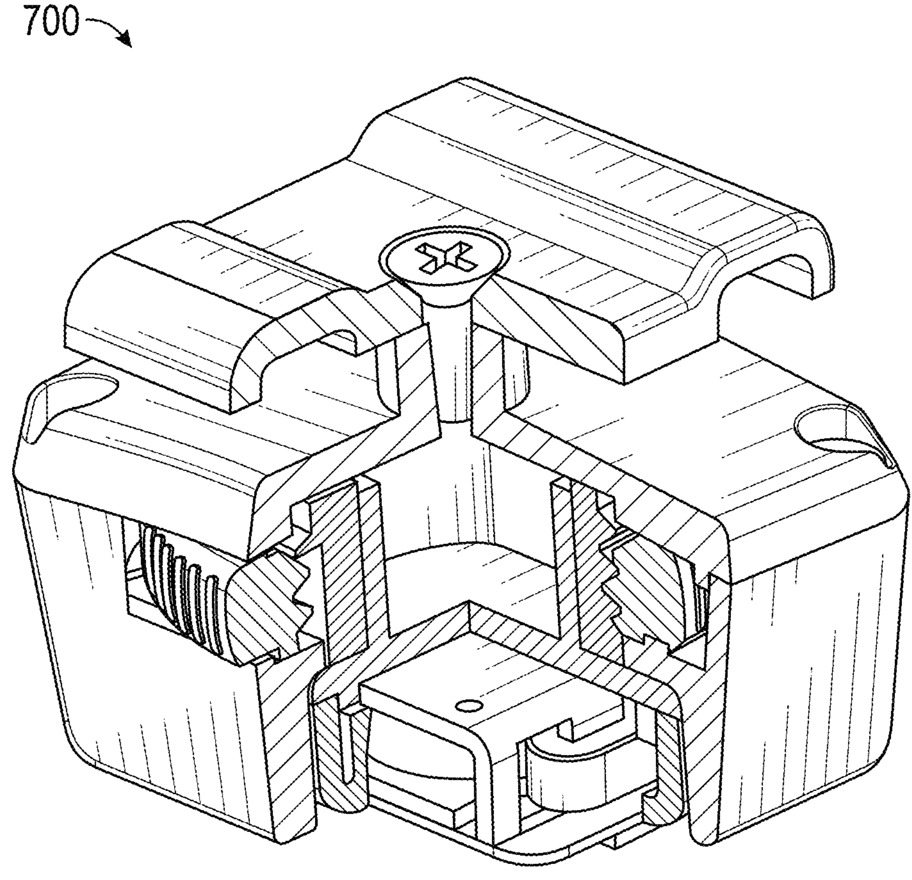
FIG. 7 is a diagram of the inner components of the bone conduction module of the biosensing VR headset.

FIG. 6 is a diagram 600 of a bone conduction module of the biosensing VR headset. FIG. 7 is a diagram 700 of the inner components of the bone conduction module of the biosensing VR headset. For example, the bone conduction module in diagrams 600 and 700 may be bone conduction module 212 in FIG. 2. The bone conduction module includes house 602, which includes the inner sensor components of the bone conduction module. The module further includes a module-fixing member 604 (corresponding to module-fixing member 214).

The bone conduction module further includes rotatable component 606, which lowers/raises electrode 610 shown in perspective 608 as rotatable component 606 is rotated. This enables improved contact between electrode 610 and the surface of the head of a wearer.

Figure 8A:
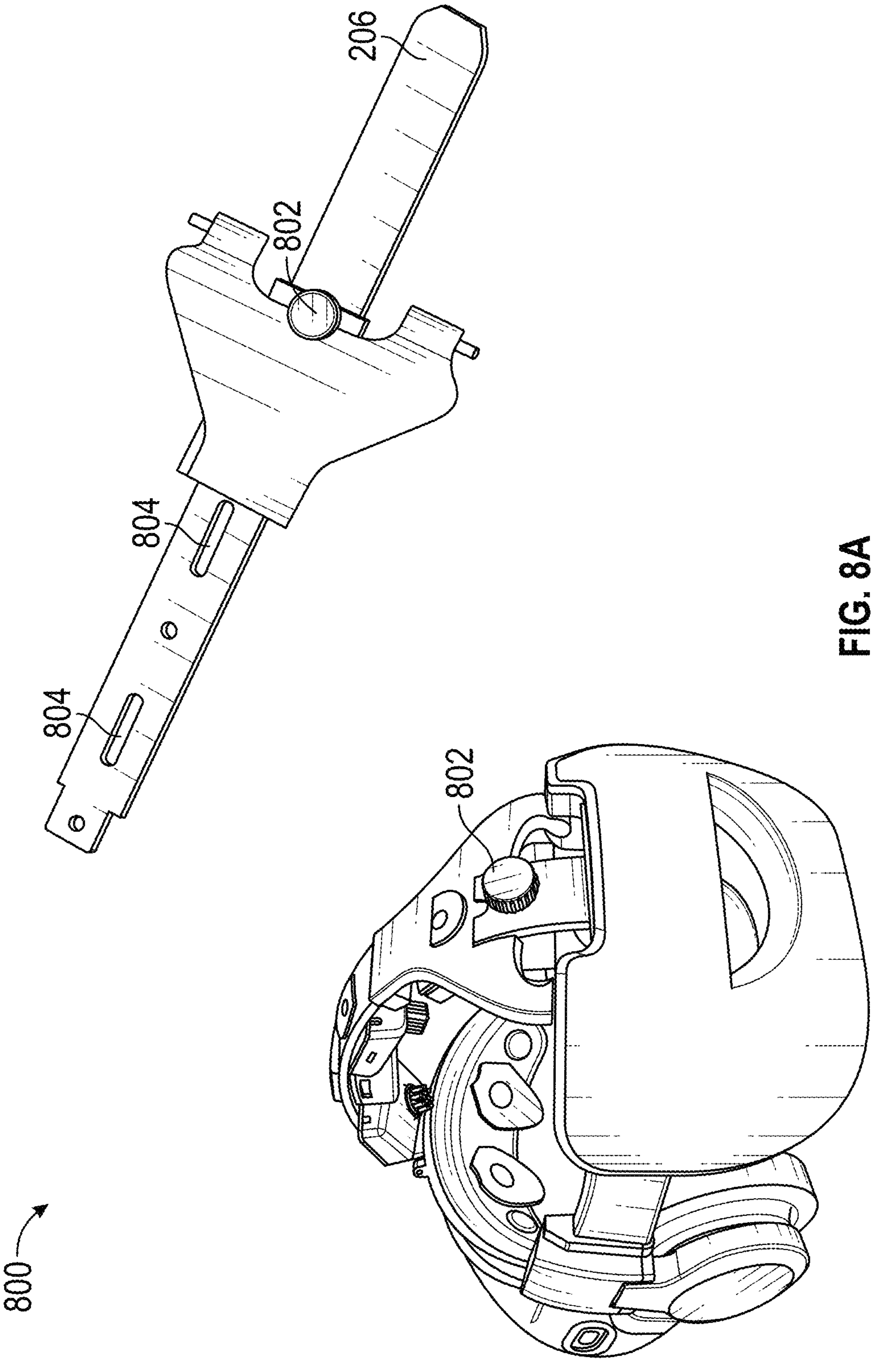
FIG. 8A is a diagram that displays an isolated view of the overhead member.

FIG. 8A is a diagram 800 that displays an isolated view of overhead member 206. Overhead member 206 includes a length-adjustment member 802 (e.g., a knob) that enables adjustment of the sagittal band length to accommodate various head dimensions. When the length-adjustment member 802 is loosened, a wearer can increase or decrease the length. When the length-adjustment member 802 is tightened, a wearer can fix the length after the adjustment.

Overhead member further includes slits 804, which are gaps through which module-fixing members can be passed through and connected with their corresponding electrode members. For example, module-fixing member 214 may be put through one of slits 804 through a first side and module 212 may be connected to module-fixing member 214 from the opposite side such that both members are fixed to overhead member 206. The lengths of slits 804 further determine how much the connected members can be shifted. For example, module-fixing member 214 may be untightened (e.g., by rotating member 214) to loosen module 208 from overhead member 206. Once loosened, member 214 may be moved along overhead member 206 (which also moves module 208 due to its connection with member 214) within the boundaries of one of slits 804. Once a new position has been selected, member 214 may be retightened (e.g., by rotating member 214 in the opposite direction) to ensure that module 208 remains in the newly selected position.

Figure 8B:
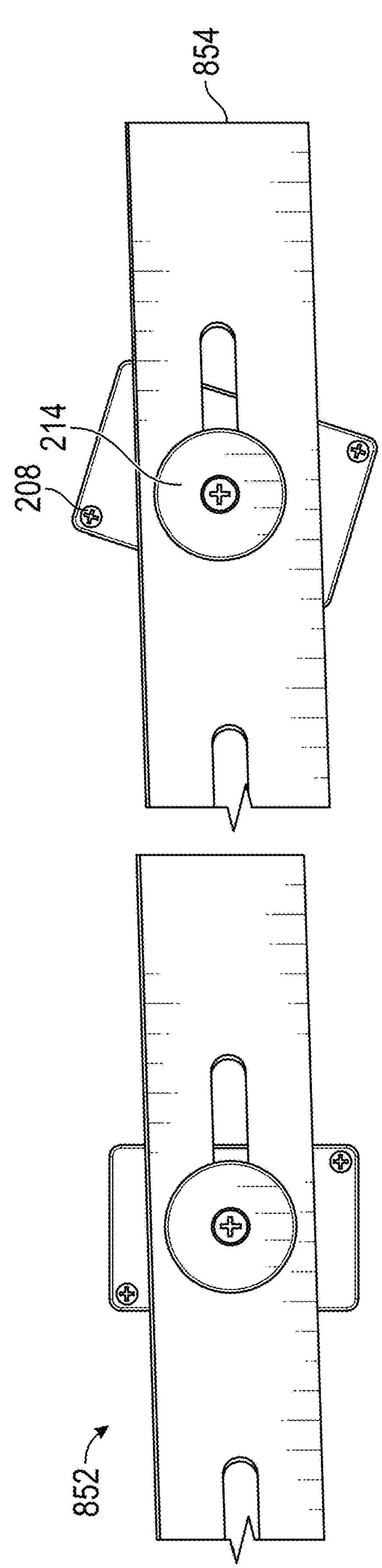
FIG. 8B is a diagram that displays different rotation configurations of a module connected to the overhead member.
Figure 8B:
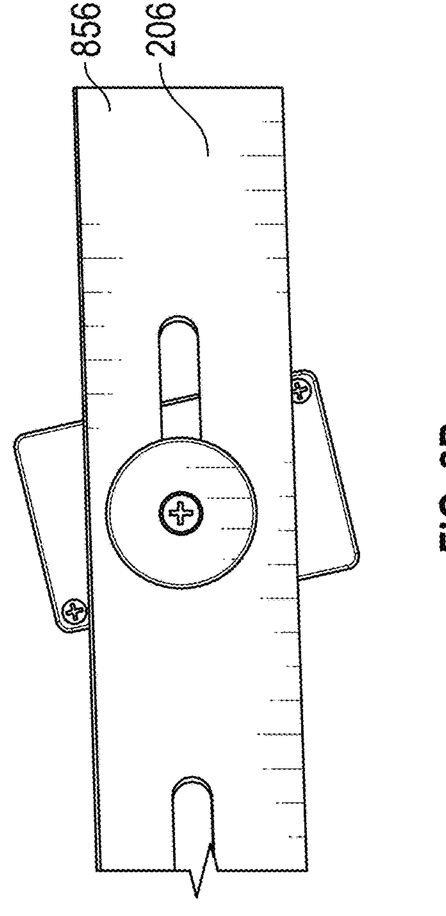

FIG. 8B is a diagram 850 that displays different rotation configurations of a module (bone conduction and/or electrode) connected to the overhead member. For example, rotation configuration 852 displays module 208 rotated at a first angle, rotation configuration 854 displays module 208 rotated at a second angle, and rotation configuration 856 displays module 208 rotated at a third angle.

Figure 9:
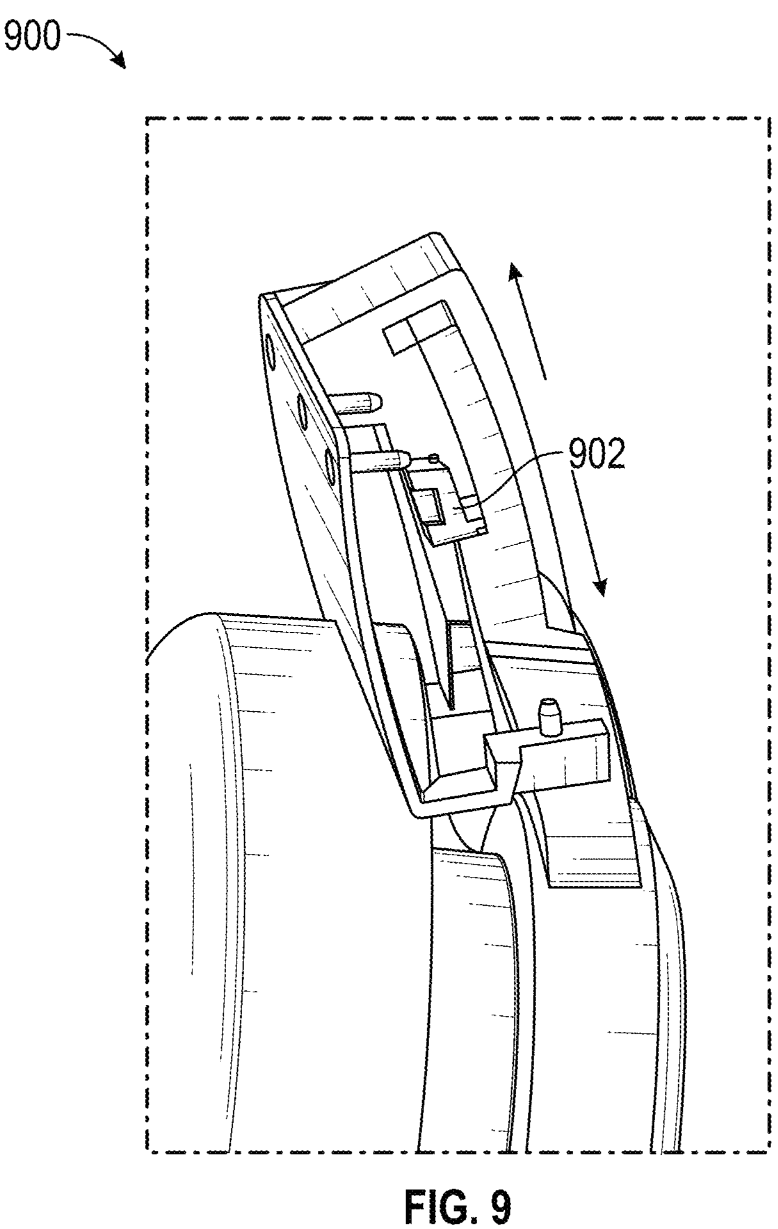
FIG. 9 is a diagram of the headphone module of the biosensing VR headset.

FIG. 9 is a diagram 900 of the headphone module of the biosensing VR headset. In particular, diagram 900 showcases attaching mechanism 902 within headphone fixing member 222. Headphones 224 may be moved up or down within headphone fixing member 222. For example, if the ears of a wearer are low, he/she can pull headphones 224 until they sit on the ears.

Figure 10:
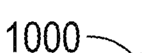
FIG. 10 is a diagram of the adjustable positioning of the headphone module.
Figure 10:
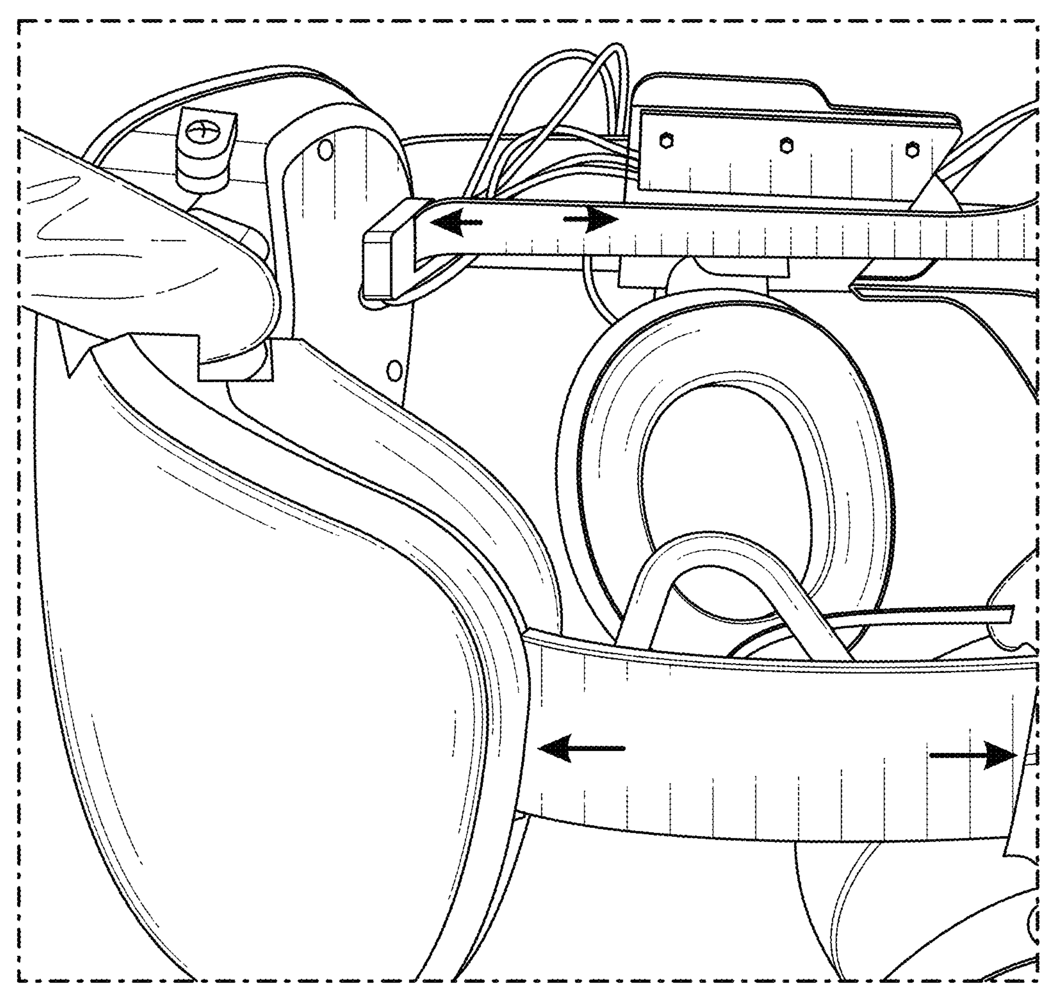

FIG. 10 is a diagram 1000 of the adjustable positioning of the headphone module. As the head size of a wearer may vary and the positioning of their ears, headphone fixing member 222 may be adjusted along side members 220. In reference for FIG. 9, vertical adjustment was described. As shown in diagram 1000, a user can extend or retract the side members 220 as well as shift where headphone fixing member 222 sits on side members 220 horizontally. It should be noted that each headphone fixing member can be moved independently.

Figure 11:
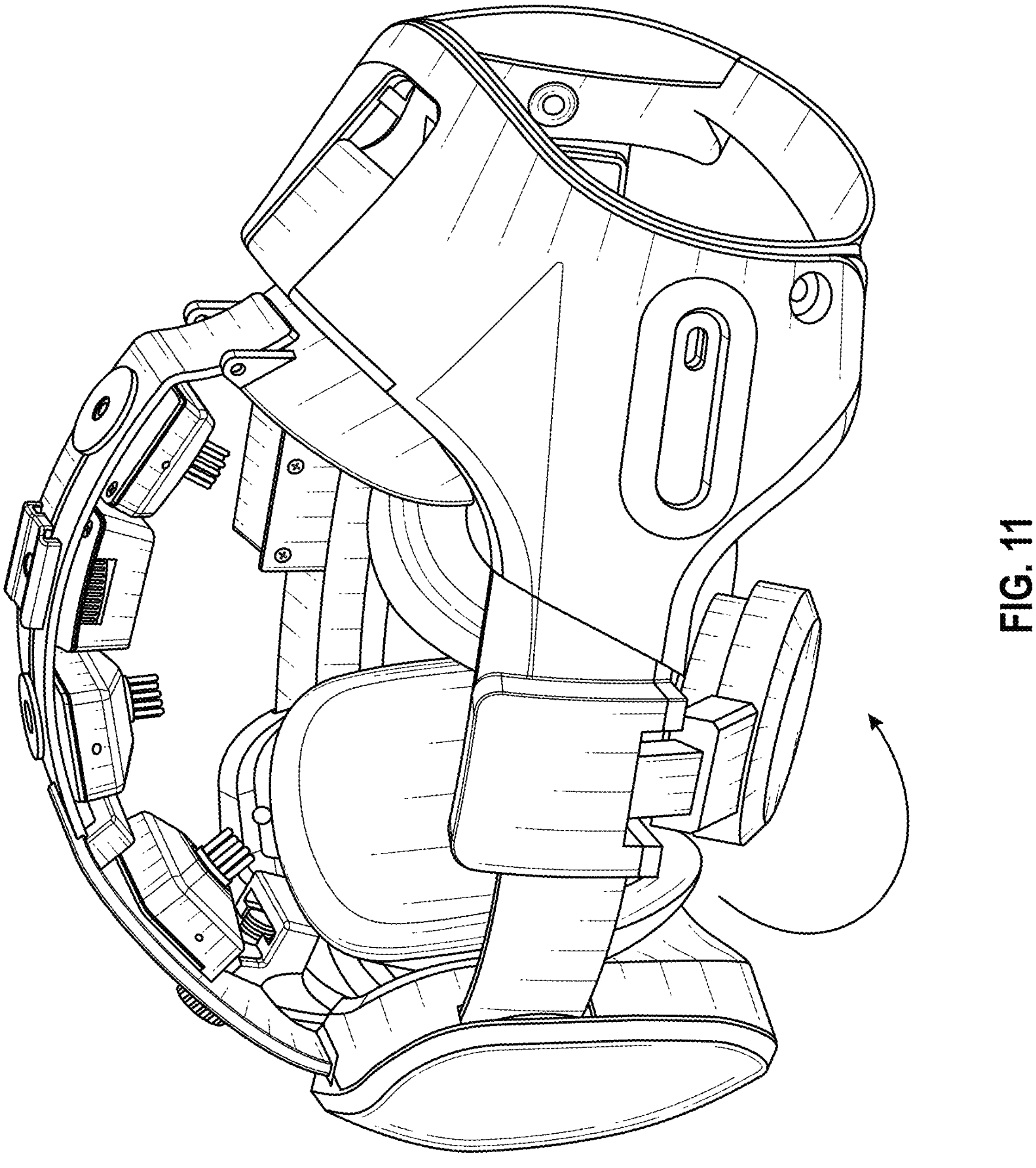
FIG. 11 is a diagram of the biosensing VR headset when the headphones are in a folded position.

FIG. 11 is a diagram 1100 of the biosensing VR headset when the headphones are in a folded position. The folded position may be utilized when the biosensing VR headset is not being worn.

Figure 12:
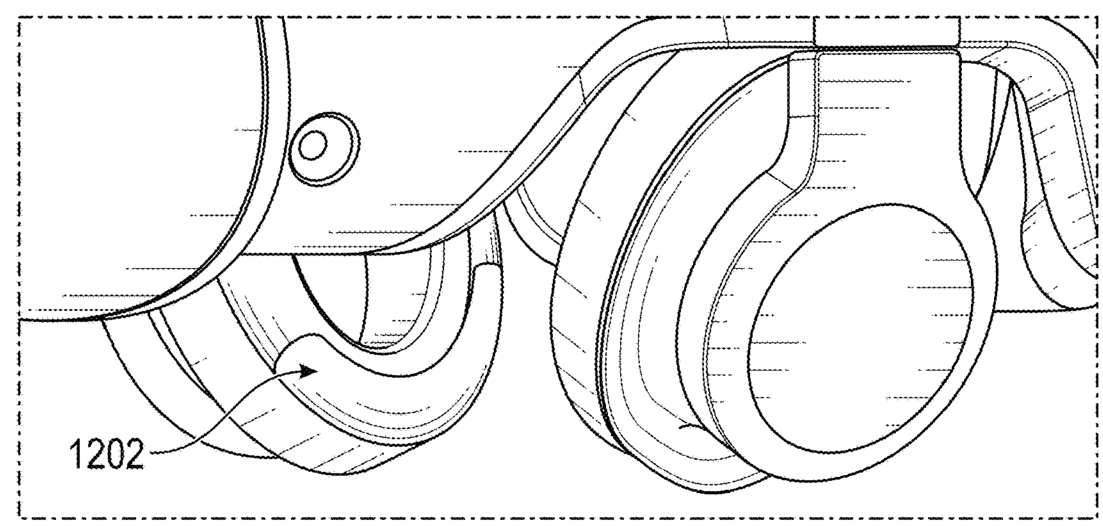
FIG. 12 is a diagram of a reference electrode in the headphone module.

FIG. 12 is a diagram 1200 of a reference electrode 1202 in the headphone module. Electrode 1202 comprises electrically-conductive fabric that is attached to the earmuffs of headphones 224 and connected to internal electronics of headphones 224 with a short wire. Electrode 1202 contacts bare skin and gives electrical contact.

Figure 13:
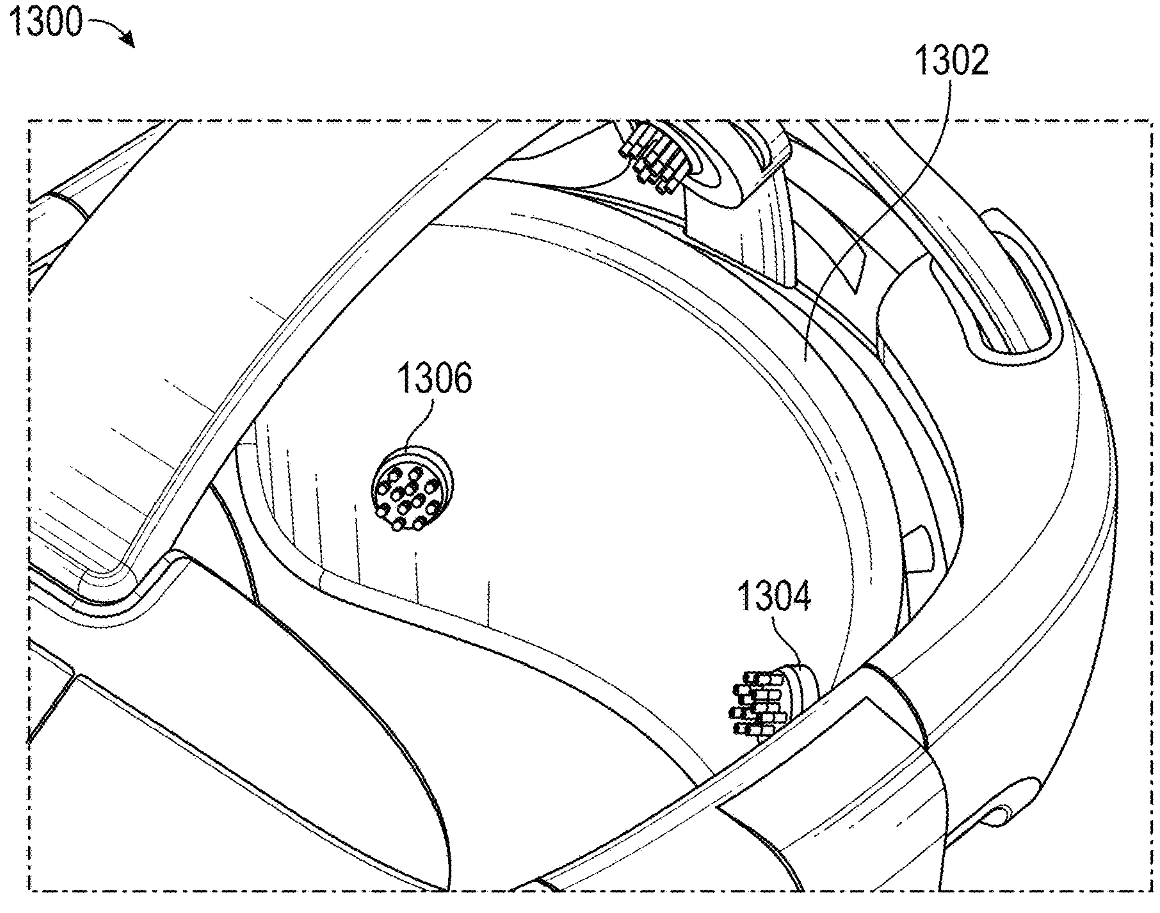
FIG. 13 is a diagram of a rear pad of the biosensing VR headset.

FIG. 13 is a diagram 1300 of a rear pad 1302 of the biosensing VR headset. Sensors 1306 and 1304 are both EEG sensors embedded into rear pad 1302. In some aspects, sensors 1306 and 1304 are brush electrodes. Sensors 1306 and 1304 may be positioned along the horizontal line of rear pad 1302. This configuration is optimal for capturing neural activity from the occipital and parietal regions of the brain, which are crucial for processing visual and sensory information. The use of brush electrodes enhances contact with the scalp, ensuring high-quality signal acquisition even through hair, which is particularly beneficial for EEG measurements. The exact number of sensors—two in this case—is important as it provides sufficient spatial coverage to capture a comprehensive range of brain activity from the targeted regions without overcrowding the rear pad. This balance ensures that the headset remains comfortable for the user while maintaining the accuracy and reliability of the data collected. By employing two well-placed sensors, the design effectively maximizes data collection efficiency and minimizes potential interference, contributing to the overall functionality and user experience of the VR headset.

Figure 14:
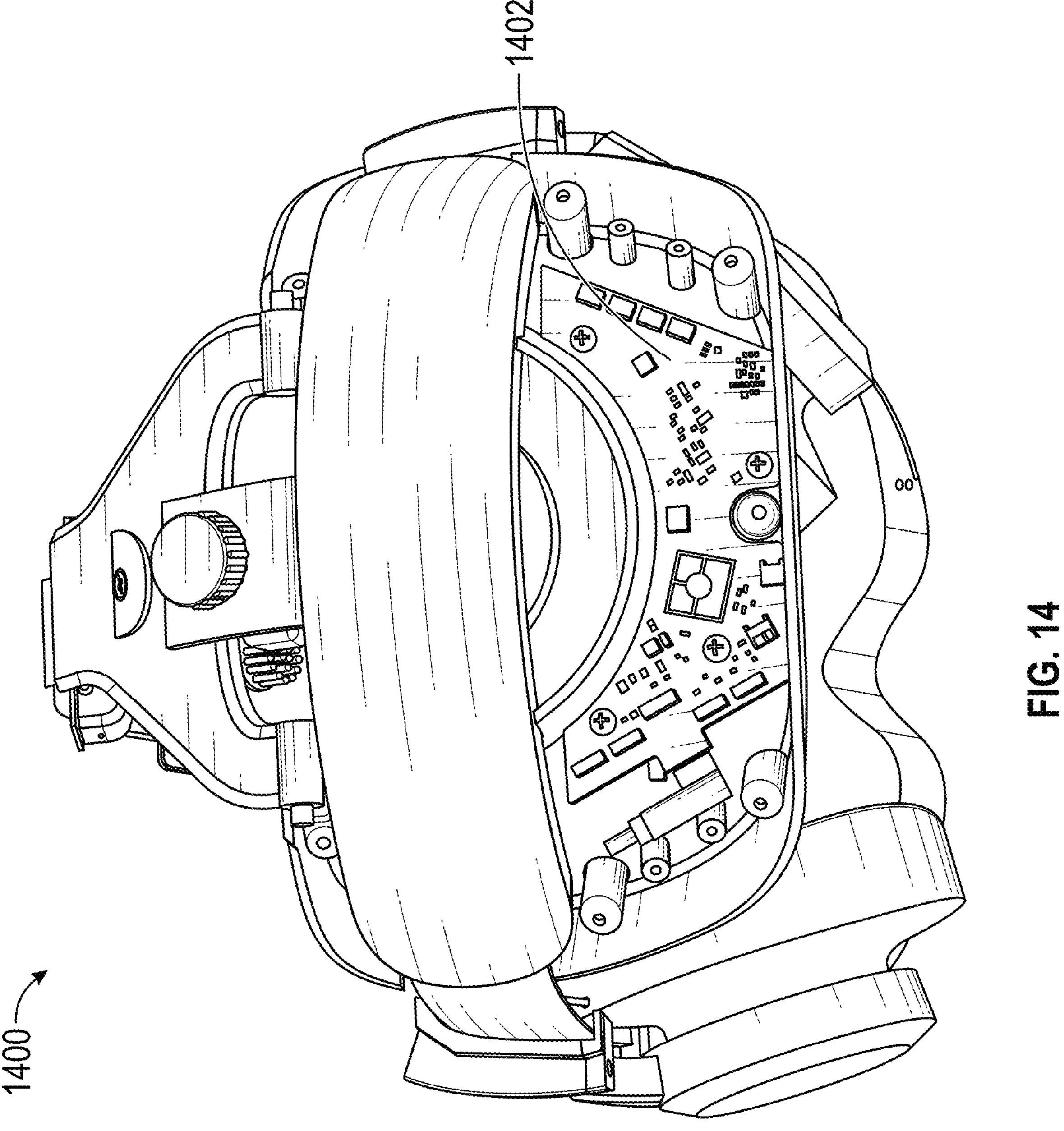
FIG. 14 is a diagram of the components housed by the rear system of the biosensing VR headset.

FIG. 14 is a diagram 1400 of the components housed by the rear system of the biosensing VR headset. The rear system includes two pieces that clamp on the headset battery. The cutout and shape of the rear system allows for unobstructed access to the knob that adjusts band dimension. Main PCB 1402 is housed by the rear system. Main PCB 1402 may be a data processing module that performs sensor fusion of all sensor data acquired from the modules and sensors described previously. In an exemplary aspect, all sensors and modules described above are connected to the data processing module through electrical wiring that is effectively hidden from the user to ensure a polished look of the biosensing VR headset.

In some aspects, sensors are not located on the main PCB, but the chipsets as part of the sensor ADC system are located on the main PCB. In addition, there may be a microcontroller on the main PCB configured to collect sensor data in a time synchronous fashion to ensure sensor data time alignment. This is important for higher-level mental state analysis. In some aspects, the data buses used between the microcontroller and sensor ADC systems may be SPI and I2C.

In some aspects, sensor signal processing algorithms used on the microcontroller are traditional digital low-pass, band-pass, and/or notch filters. More advanced AI/ML algorithm such as auto self-calibration and artifact subspace reconstruction (ASR) may be performed on the main (e.g., Qualcomm) chipset in the headset.

In addition to the features described previously, the biosensing VR headset is configured to: (1) track motion, orientation, and acceleration to analyze posture, gestures, and physical activity levels; (2) deliver, via haptic motors, tactile feedback for real-time immersive multisensory experiences, enhancing engagement and behavioral training; (3) transmit auditory feedback directly through bone conduction modules, enabling discreet and non-invasive communication of audio cues without obstructing the ears; (4) analyze (using a microphone embedded in the headphones of the VR headset) vocal tone, pitch, and speech patterns to infer emotional states and stress levels; (5) track (using cameras) gaze direction, fixation, and pupil dilation to assess attention, focus, cognitive load, and emotional responses; and (6) detect and interpret facial movements and micro-expressions, offering valuable cues about emotional and cognitive states. Through multimodal and multisensory analysis or by combining features from all modalities in time, frequency, and nonlinear domains data from these diverse sources are integrated and analyzed to create a holistic, accurate representation of the physiological and psychological state of a wearer. This enables tailored real-time monitoring, and targeted interventions to enhance mental and emotional well-being.

In some aspects, the data processing module of the biosensing VR headset is designed to transmit all collected sensor data to the onboard computer system 20 (described in more detail in FIG. 22) or to a remote server or smartphone via a network connection, such as the Internet, enabling seamless exchange of information in the cloud. This architecture allows the remote server to handle computationally intensive processing tasks that would be inefficient or impractical to perform locally on the headset due to its limited processing power and battery constraints. For instance, certain VR applications can significantly benefit from the integration of advanced machine learning (ML) techniques to extrapolate, interpret, and analyze the complex biometric data collected by the headset's sensors.

The remote server may be equipped to receive this sensor data and execute sophisticated machine learning algorithms, such as deep learning (DL) models or neural networks, which require substantial computational resources and data storage capabilities. These algorithms can process large volumes of data to identify patterns, make predictions, or provide insights that enhance the VR experience. Once the processing is complete, the server transmits the results back to the biosensing VR headset, enabling real-time feedback and interaction within the VR environment. This setup not only enhances the functionality and responsiveness of the VR applications but also ensures that the headset remains lightweight and user-friendly by offloading heavy computational tasks to the cloud. In a particular scenario, the remote server may generate custom VR/audio content for the user based on the sensor data. In some aspects, the data processing module may create a feedback loop where neurological data from the user is constantly monitored and custom VR/audio content is generated to reduce stress and improve wellness of the user.

Figure 15:
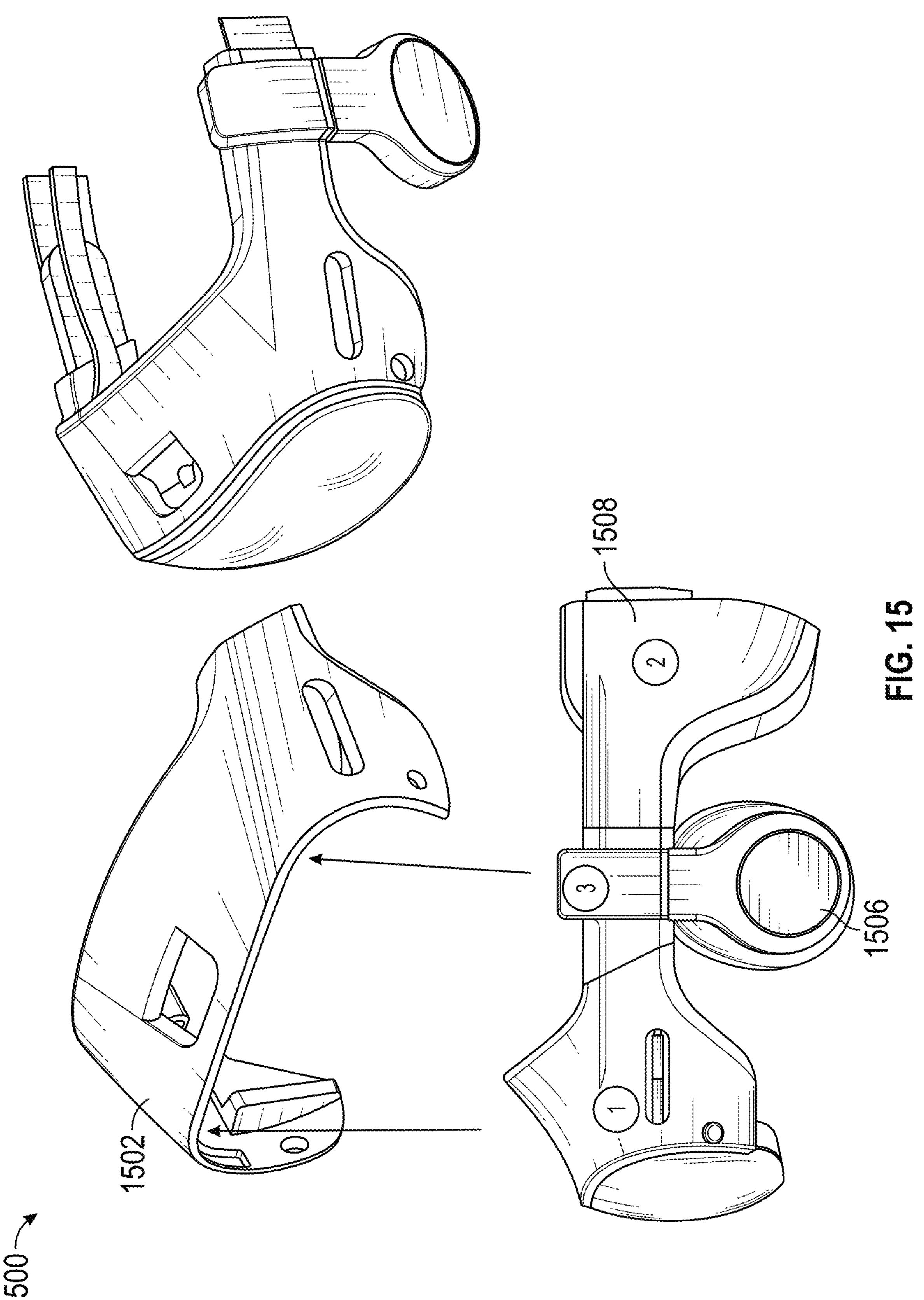
FIG. 15 is a diagram of an system of the biosensing VR headset.

FIG. 15 is a diagram of a system of the biosensing VR headset. The system is a custom made silicon cover that provides for a clean visual look that hides cables and sensor components of the biosensing VR headset. The system includes front piece 1502, side piece 1504, headphone covers 1506, rear piece 1508, and a sagittal band cover. In some aspects, the system is replaceable and allows for users to customize their headset (e.g., designs, colors, etc.).

Figure 16:
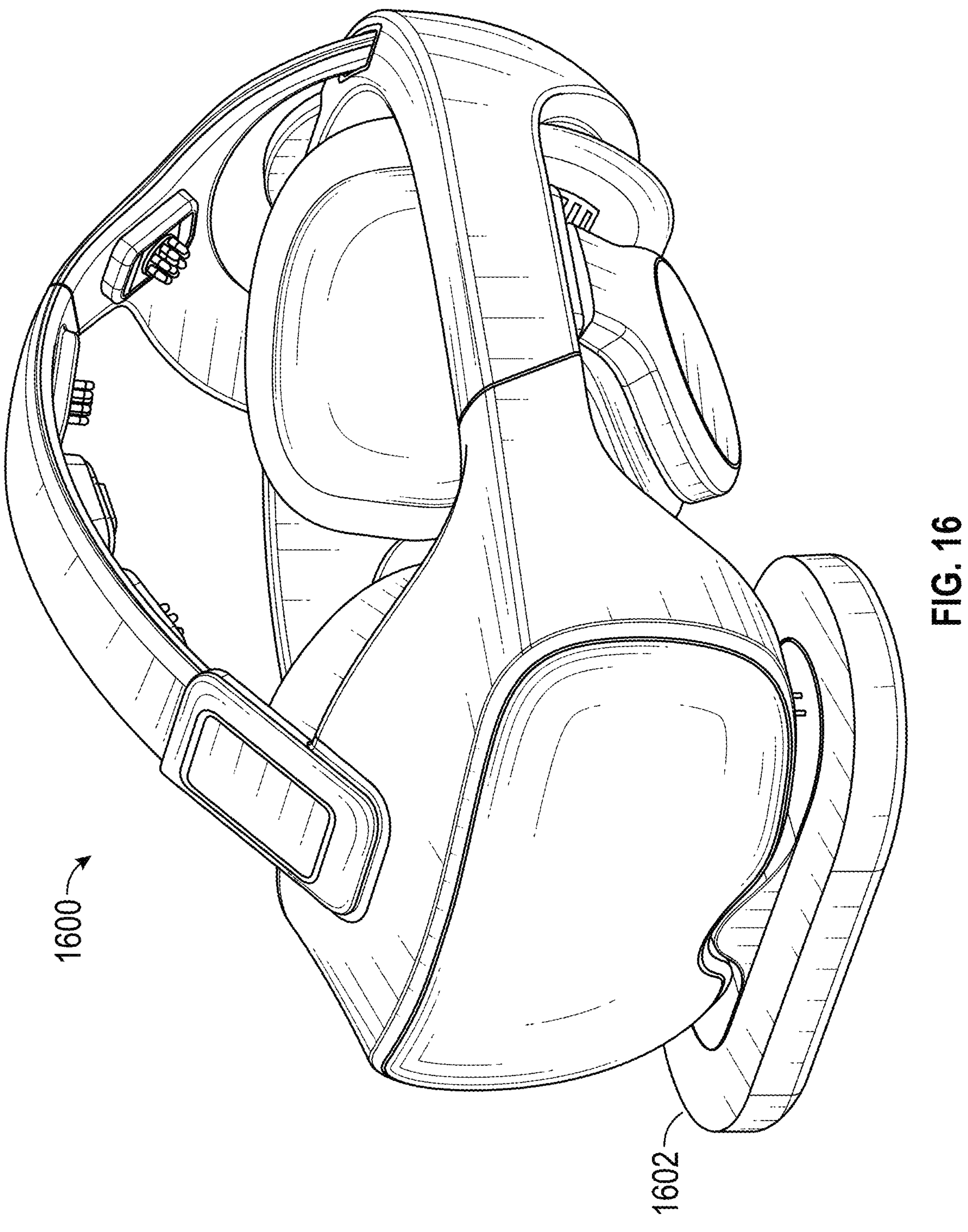
FIG. 16 is a diagram of the biosensing VR headset docked on a docking station.

FIG. 16 is a diagram 1600 of the biosensing VR headset docked on a docking station 1602. The docking station 1602 serves as a secure resting place for the VR headset, with the display side of the headset fitting into the station. This design not only ensures the safety of the delicate display components but also facilitates seamless connectivity and charging. In some aspects, the docking station 1602 is equipped with wireless charging capabilities, allowing the headset to recharge its batteries without the need for cables. This feature is particularly beneficial for maintaining the headset's readiness for use, ensuring that it is always fully charged and operational.

In some aspects, the docking station 1602 supports a range of functionalities. It may connect to the VR headset via Bluetooth or Wi-Fi, enabling automatic synchronization of data collected by the biosensors during VR sessions. This data can include physiological metrics such as heart rate, skin temperature, and brainwave activity, which are transmitted to the docking station and then to connected devices like computers or smartphones for analysis. Additionally, the docking station may offer wireless connectivity to external devices, such as speakers or smart home systems, enhancing the immersive experience by integrating with other technologies. The station might also support firmware updates over the air, ensuring that the headset's software is always up-to-date with the latest features and security patches.

Figure 17:
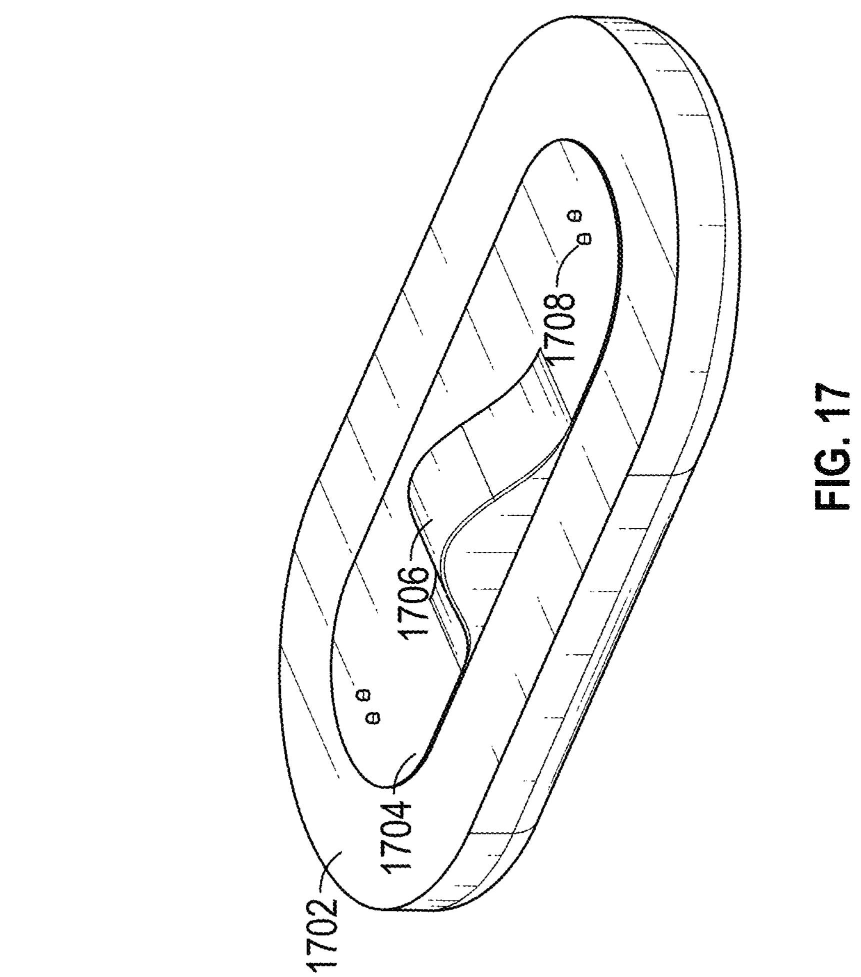
FIG. 17 is a diagram of the docking station.

FIG. 17 is a diagram 1700 of the docking station. In some aspects, the docking station has an outer perimeter 1702 made out of wood (e.g., western hemlock). The inner section 1704 of the docking station is made out of silicone. The inner section may have a groove 1706 that matches the shape of the lower portion of the VR display (e.g., the nose bridge area). This allows for the biosensing VR headset to sit snugly on the docking station. The inner section may further include electric contacts 1708 (e.g., 4 in count) that connect with electric contacts of the biosensing VR headset and ultimately enable charging.

Figure 18:
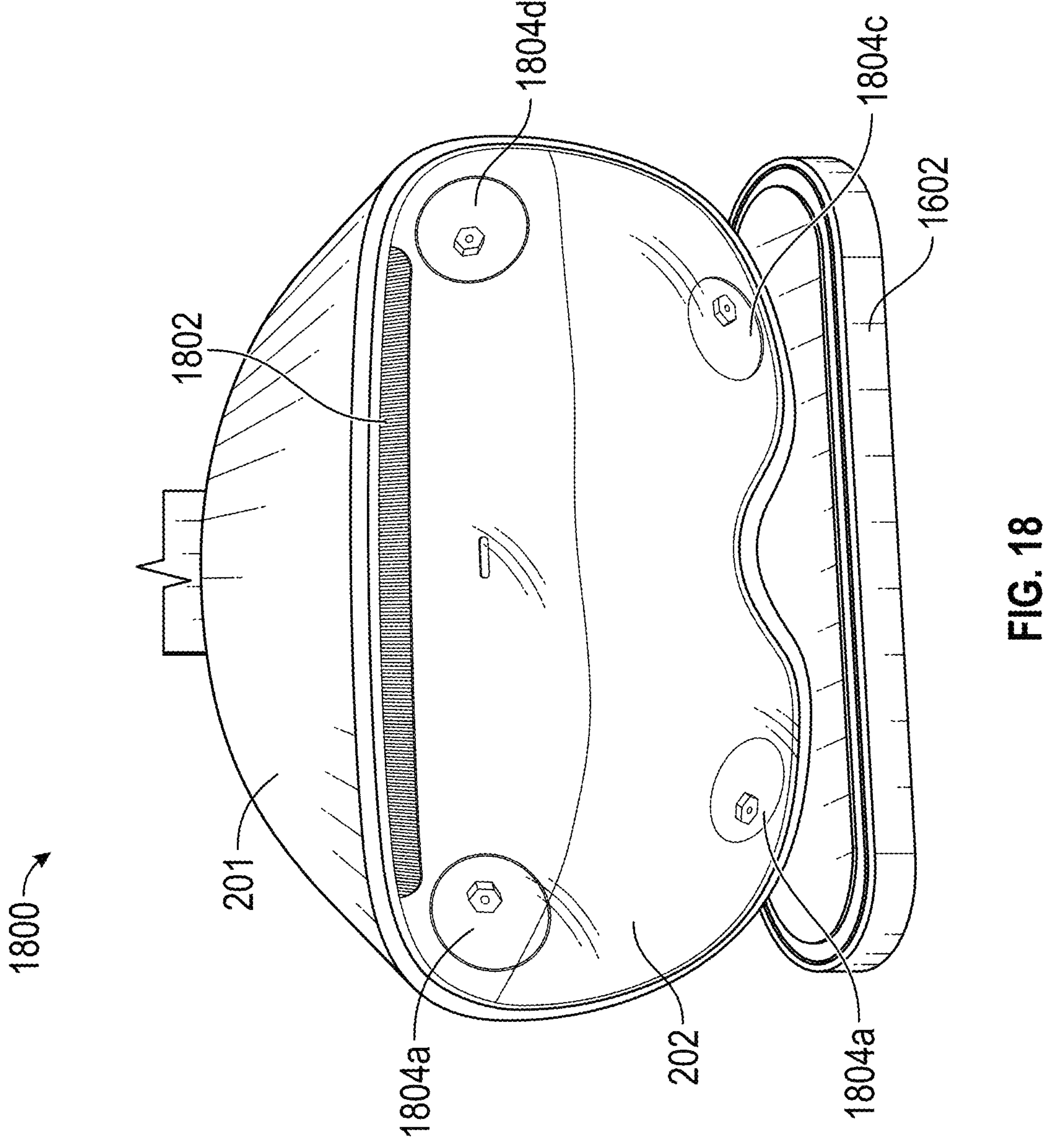
FIG. 18 is a diagram of the biosensing VR headset from a front-view perspective.

FIG. 18 is a diagram 1800 of the biosensing VR headset from a front-view perspective. Display portion 202 shown in diagram 1800 includes a plurality of cameras-top-left camera 1804*a*, bottom-left camera 1804*b*, bottom-right camera 1804*c*, and top-right camera 1804*a*. In some aspects, each camera is a six degrees of freedom camera (6DoF).

Diagram 1800 specifically depicts a lens 1801 of display portion 202. In some aspects, each camera is positioned behind lens 1801 of display portion 202. The curvature of lens 1801 is sculpted to ensure that the viewing range of each camera is not interrupted or hindered by the back painted areas of display portion 202. The curved design conceals the plurality of cameras underneath lens 1801 without necessitating designated, physical openings.

Diagram 1800 further depicts vent 1802, which is an elongated front vent integrated into lens 1801. In some aspects, vent 1802 stretches above the midpoint of camera 1804*a* to a point above the midpoint of camera 1804*d*. Vent 1802 allows heat to exit through front system 201 and features a unique ventilation mechanical design beneath its cosmetic grille.

In some aspects, outlet at vent 1802 may include an acoustically and cosmetically continuous grille pattern whose open-area ratio is chosen to preserve the clean exterior appearance while minimizing exit losses; in some aspects, the grille louvers are angled to reduce stray light ingress and to shield internal surfaces from dust accumulation.

Figure 19:
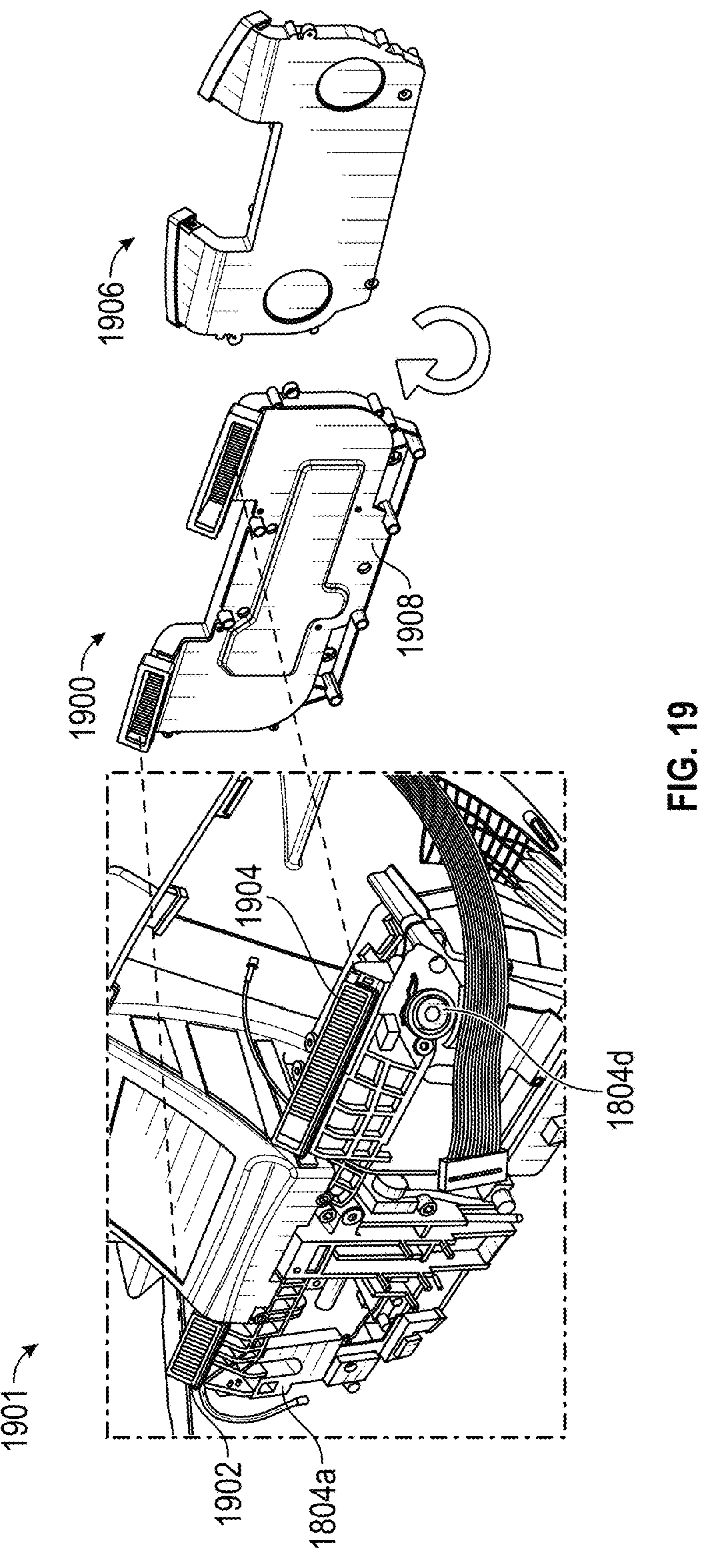
FIG. 19 is a diagram of the vent assembly and integration of the vent assembly in the front system.

FIG. 19 is an internal diagram 1900 of a vent assembly. FIG. 19 further depicts diagram 1901 of the vent assembly integrated in the front system 201 and diagram 1906 of the back-facing view of the vent assembly. In particular, diagram 1901 depicts the front part of VR headset without lens 1801 and front piece 1502. In some aspects, the structure of the front part is made of bent sheet metal.

As shown, the VR headset includes a venting assembly that preserves a clean exterior form while using two stacked, chimney-like vent structures 1902 and 1904 to enable exhaust airflow and breathing through the device enclosure. Vent structures 1902 and 1904 specifically guide heat up and out through vent 1802.

In some aspects, the forward-facing member 1908 of this vent assembly is constructed from copper, which simultaneously serves as an exterior enclosure element and as a heat sink for thermal management. By integrating the copper component as a dual-function structural and thermal element, the design dissipates internally generated heat in a very compact space and routes exhaust through the structures 1902 and 1904 to facilitate cooling. This integrated approach allows the headset to achieve effective heat dissipation and exhaust in a very thin overall package without compromising the outward appearance.

Figure 20:
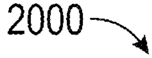
FIG. 20 is an internal diagram of the front system from a side-view perspective.
Figure 20:
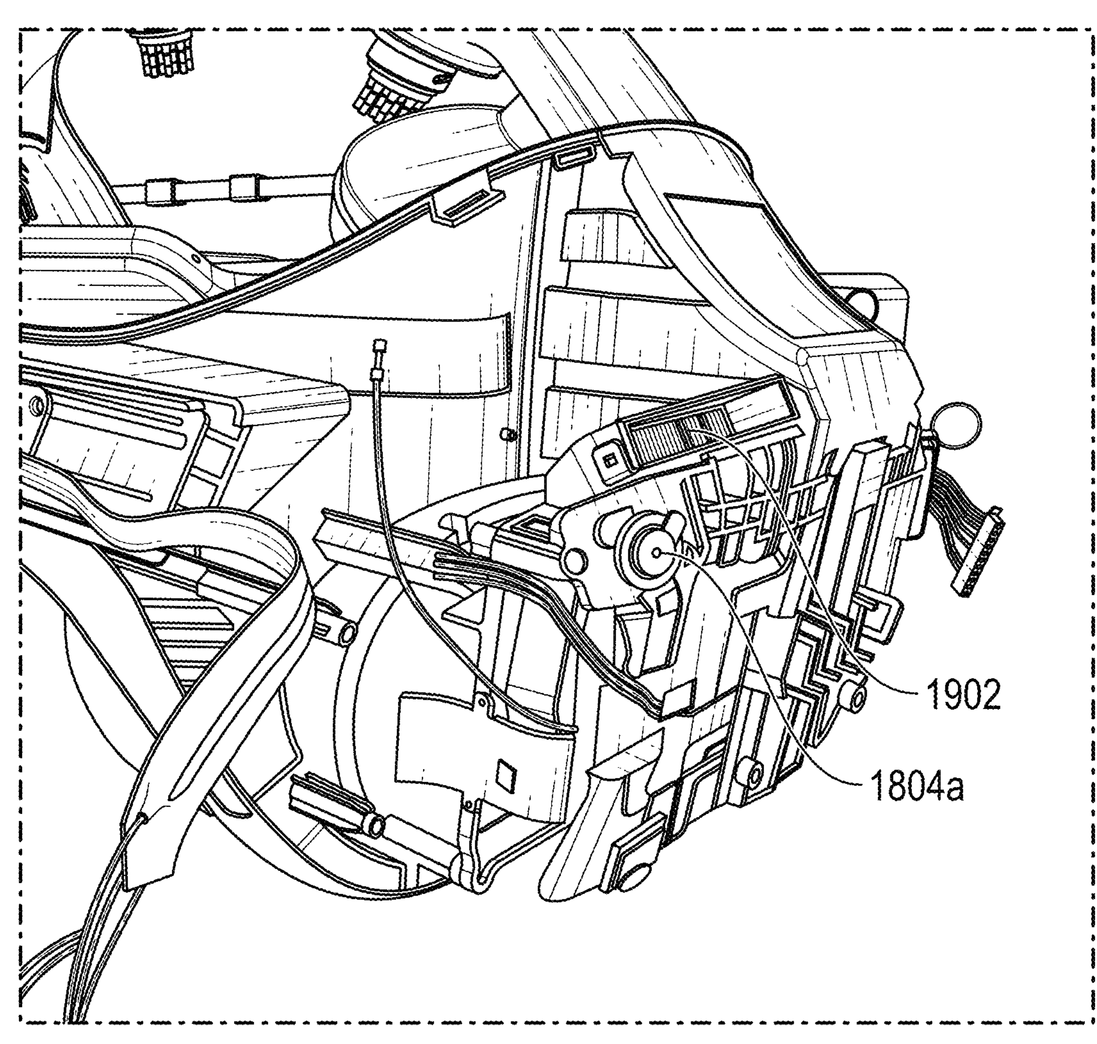

FIG. 20 is an internal diagram 2000 of the front system 201 from a side-view perspective. In some aspects, the stacked vent structures 1902 and 1904 begin at a lower plenum region proximate to primary heat sources within the front system 201—such as display driver electronics, graphics/compute chipsets, or power regulation modules—and extend upward in a generally vertical direction to terminate at the elongated exterior vent 1802, thereby defining a guided convection path that leverages buoyancy to carry heated air to the outlet without recirculation into the enclosure.

The lower plenum may be formed by portions of the bent sheet-metal frame and internal baffles that partition the intake region from internal components, establishing a pressure and flow boundary that directs air into the lower ends of the chimney passages while inhibiting lateral leakage.

In some aspects, the forward-facing copper member may act as a heat spreader that couples thermally to the heat sources via thermal interface materials. In some aspects, integrated fins or micro-texturing on the interior surface may be used to increase effective surface area and improve heat exchange to the moving air column within the chimneys. To promote stable, low-turbulence flow, the chimneys may include converging inlets transitioning to constant cross-sections sized to balance pressure drop and acoustic transparency; for example, a chimney height spanning the vertical separation between the electronics plenum and vent 1802 with widths on the order of a few millimeters and aspect ratios selected to maintain favorable Reynolds numbers under fanless operation.

In certain implementations, separation walls between 1902 and 1904 may create thermally decoupled channels so that each chimney draws from distinct subregions of the electronics bay, reducing hotspots and equalizing exit temperatures at 1802. The copper member thickness and local geometry can be tuned to manage in-plane heat spreading toward the chimneys while maintaining the thin industrial design; for example, a sheet or formed section that provides both structural enclosure and a low-thermal-resistance path to the airflow, optionally supplemented by a vapor chamber or heat pipe stubs that deliver heat to upstream segments of 1902/1904 to jump-start natural convection.

Figure 21:
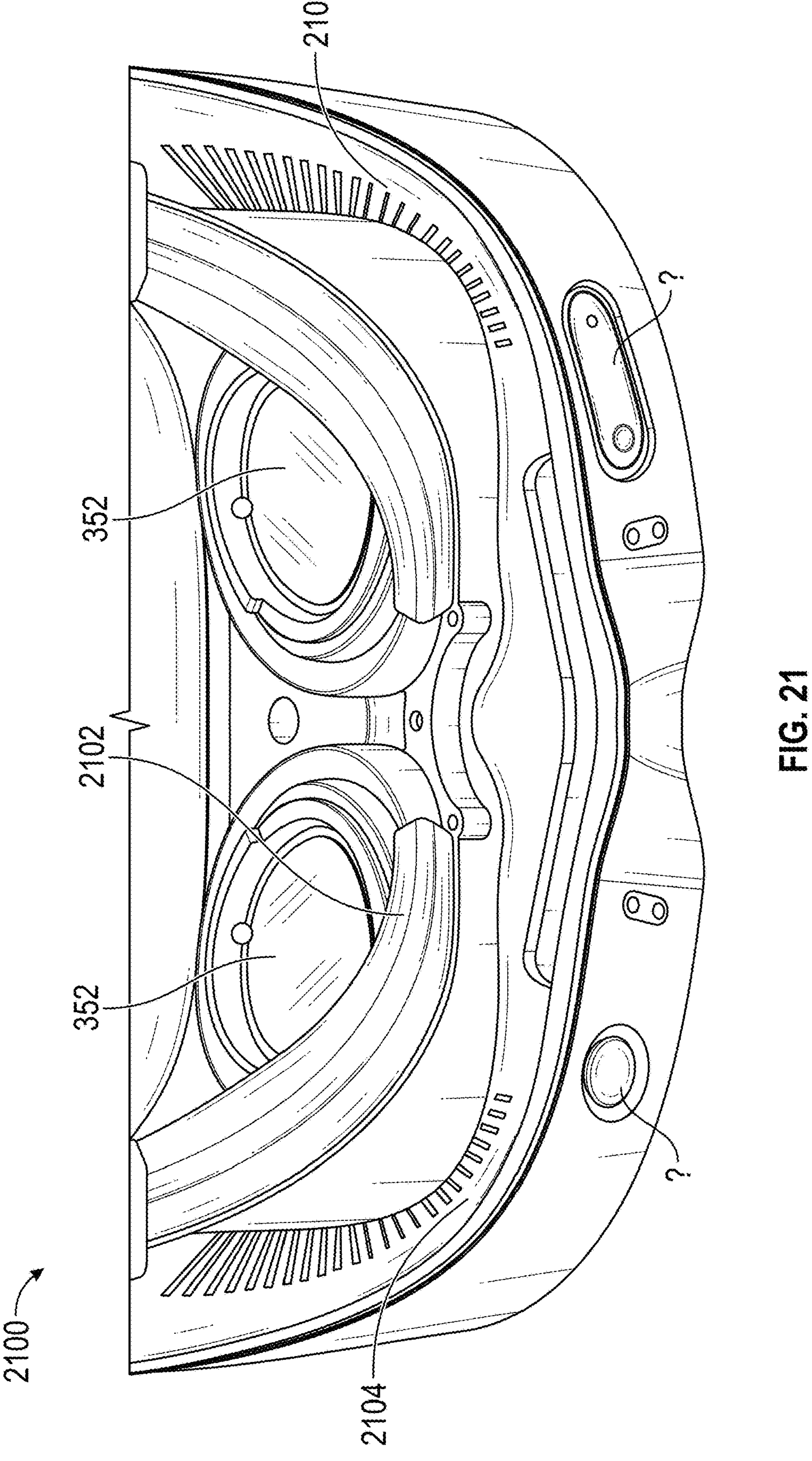
FIG. 21 is a diagram of the front system from a bottom-view perspective.

FIG. 21 is a diagram 2100 of the front system 201 from a bottom-view perspective. Diagram 2100 depicts face mask 2102, which is large enough to accommodate eyewear (e.g., glasses) that a wearer may use during a usage session. Face mask 2102 features padding around its boundary and a nose bridge 2104. In an area of front system 201 outside of facemask 2102 are vents 2106 and 2108, which sit on the left and right side of facemask 2102, respectively.

In some aspects, side vents 2106 and 2108 function as distributed intake apertures positioned outside the face mask 2102 perimeter so that cool ambient air is entrained along the underside of the front system and routed around the nose-bridge region 2104 into lower plenums that couple directly to the inlets of the stacked chimneys, thereby closing a front-to-top convective loop.

The intake geometry may include hydrophobic, dust-trapping meshes or micro-perforated panels that are recessed to avoid contact with the face of the wearer, with baffles that prevent line-of-sight light leakage toward the display while guiding air into the internal channels formed by the bent metal structure.

To maintain comfort and prevent drafts, the flow path is arranged to keep intake velocities low near the face seal while increasing channel velocity within the internal ducts; this can be achieved by a larger cumulative intake area at vents 2106 and 2108 transitioning to narrower internal passages that feed the chimney structures 1902 and 1904, with louvers or check-flap features that bias flow direction and reduce backflow during user motion.

In some aspects, each side vent feeds a dedicated lower manifold aligned with the corresponding chimney (1902 for the left side and 1904 for the right side), which balances mass flow between channels and reduces cross-talk; the manifolds may incorporate flow straighteners upstream of the chimney entrances to stabilize the thermal plume. The proximity of vents 2106 2108 to the outer edges of the face mask 2102 also preserves eyewear clearance while locating the intake away from the display optics; the resulting intake-chimney-outlet topology supports both passive convection and optional low-profile microblowers without altering the external appearance of the elongated vent 1802.

Figure 22:
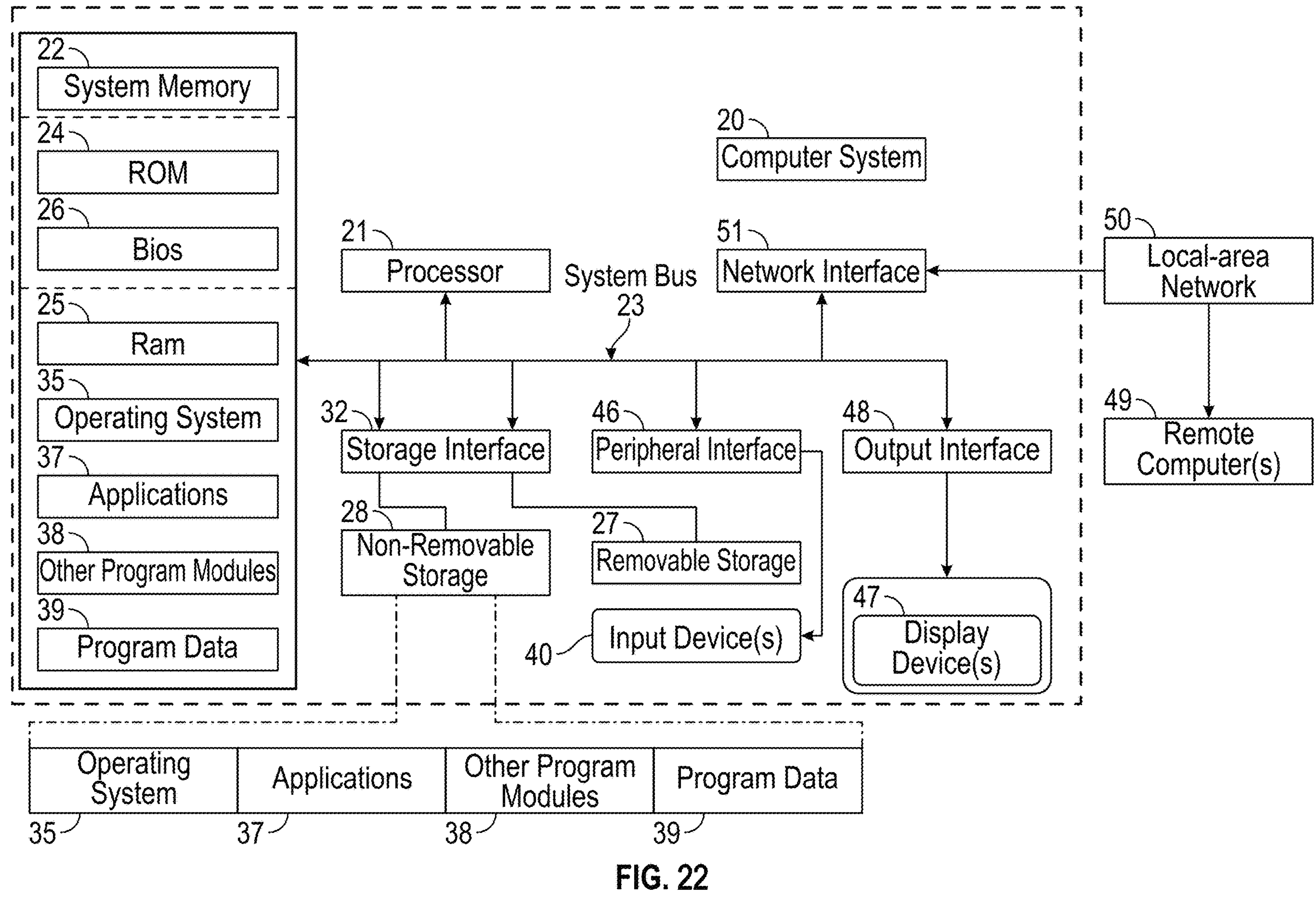
FIG. 22 is a block diagram illustrating the circuitry and components of the biosensing VR headset.

FIG. 22 is a block diagram illustrating the circuitry and components (referred to as computer system 20) of the biosensing VR headset. As shown, the computer system 20 includes a central processing unit (CPU) 21, a system memory 22, and a system bus 23 connecting the various system components, including the memory associated with the central processing unit 21. The system bus 23 may comprise a bus memory or bus memory controller, a peripheral bus, and a local bus that is able to interact with any other bus architecture. Examples of the buses may include PCI, ISA, PCI-Express, HyperTransport™, InfiniBand™, Serial ATA, I2C, and other suitable interconnects. The central processing unit 21 (also referred to as a processor) can include a single or multiple sets of processors having single or multiple cores. The processor 21 may execute one or more computer-executable code implementing the techniques of the present disclosure. For example, any of the commands/steps discussed in FIGS. 1-21 may be performed by processor 21. The system memory 22 may be any memory for storing data used herein and/or computer programs that are executable by the processor 21. The system memory 22 may include volatile memory such as a random access memory (RAM) 25 and non-volatile memory such as a read only memory (ROM) 24, flash memory, etc., or any combination thereof. The basic input/output system (BIOS) 26 may store the basic procedures for transfer of information between elements of the computer system 20, such as those at the time of loading the operating system with the use of the ROM 24.

The computer system 20 may include one or more storage devices such as one or more removable storage devices 27, one or more non-removable storage devices 28, or a combination thereof. The one or more removable storage devices 27 and non-removable storage devices 28 are connected to the system bus 23 via a storage interface 32. In an aspect, the storage devices and the corresponding computer-readable storage media are power-independent modules for the storage of computer instructions, data structures, program modules, and other data of the computer system 20. The system memory 22, removable storage devices 27, and non-removable storage devices 28 may use a variety of computer-readable storage media. Examples of computer-readable storage media include machine memory such as cache, SRAM, DRAM, zero capacitor RAM, twin transistor RAM, eDRAM, EDO RAM, DDR RAM, EEPROM, NRAM, RRAM, SONOS, PRAM; flash memory or other memory technology such as in solid state drives (SSDs) or flash drives; magnetic cassettes, magnetic tape, and magnetic disk storage such as in hard disk drives; and any other medium which may be used to store the desired data and which can be accessed by the computer system 20.

In the biosensing VR headset, the electrical wiring is integrated to connect essential components such as sensors, displays, audio systems, and processing units. The wiring is routed internally through the system's frame, utilizing channels or grooves designed to securely hold and guide the wires along the contours of the structure. Flexible flat cables (FFC) are employed due to their thin, flexible nature, allowing them to fit within the compact design and accommodate user movements and size adjustments. To ensure stability and prevent tangling, cable management systems like clips, ties, or adhesive strips are used. The wires are further protected by durable, non-conductive sheathing, shielding them from wear and electrical interference. The electrical wiring is integrated with the headset's padding and liners, which not only enhance comfort but also conceal and protect the wires from the wearer's view. Additionally, the outer shell of the system is designed to completely enclose the internal wiring, safeguarding the wiring from external damage and environmental factors, thereby maintaining both the aesthetic appeal and functional integrity of the headset.

The system memory 22, removable storage devices 27, and non-removable storage devices 28 of the computer system 20 may be used to store an operating system 35, additional program applications 37, other program modules 38, and program data 39. The computer system 20 may include a peripheral interface 46 for communicating data from input devices 40, such as a keyboard, mouse, stylus, game controller, voice input device, touch input device, or other peripheral devices, such as a printer or scanner via one or more I/O ports, such as a serial port, a parallel port, a universal serial bus (USB), or other peripheral interface. A display device 47, which may be housed in the front system 201 of the system such as one or more integrated display(s) (e.g., OLED, LCD, AMOLED) may also be connected to the system bus 23 across an output interface 48, such as a video adapter. In addition to the display devices 47, the computer system 20 may be equipped with other peripheral output devices (not shown), such as loudspeakers and other audiovisual devices.

The computer system 20 may operate in a network environment, using a network connection to one or more remote computers 49. The remote computer (or computers) 49 may be local computer workstations or servers comprising most or all of the aforementioned elements in describing the nature of a computer system 20. Other devices may also be present in the computer network, such as, but not limited to, routers, network stations, peer devices or other network nodes. The computer system 20 may include one or more network interfaces 51 or network adapters for communicating with the remote computers 49 via one or more networks such as a local-area computer network (LAN) 50, a wide-area computer network (WAN), an intranet, and the Internet. Examples of the network interface 51 may include an Ethernet interface, a Frame Relay interface, SONET interface, and wireless interfaces.

Aspects of the present disclosure may be a system, a method, and/or a computer program product. The computer program product may include a computer readable storage medium (or media) having computer readable program instructions thereon for causing a processor to carry out aspects of the present disclosure. System 20 is capable of running VR applications such as those provided by Google VR, Oculus Rift, HTC Vive.

The computer readable storage medium can be a tangible device that can retain and store program code in the form of instructions or data structures that can be accessed by a processor of a computing device, such as the computing system 20. The computer readable storage medium may be an electronic storage device, a magnetic storage device, an optical storage device, an electromagnetic storage device, a semiconductor storage device, or any suitable combination thereof. By way of example, such computer-readable storage medium can comprise a random access memory (RAM), a read-only memory (ROM), EEPROM, a hard disk, a memory stick, etc. As used herein, a computer readable storage medium is not to be construed as being transitory signals per se, such as radio waves or other freely propagating electromagnetic waves, electromagnetic waves propagating through a waveguide or transmission media, or electrical signals transmitted through a wire.

Computer readable program instructions described herein can be downloaded to respective computing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network interface in each computing device receives computer readable program instructions from the network and forwards the computer readable program instructions for storage in a computer readable storage medium within the respective computing device.

Computer readable program instructions for carrying out operations of the present disclosure may be assembly instructions, instruction-set-architecture (ISA) instructions, machine instructions, machine dependent instructions, microcode, firmware instructions, state-setting data, or either source code or object code written in any combination of one or more programming languages, including an object oriented programming language, and conventional procedural programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or WAN, or the connection may be made to an external computer (for example, through the Internet). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

In various aspects, the systems and methods described in the present disclosure can be addressed in terms of modules. The term "module" as used herein refers to a real-world device, component, or arrangement of components implemented using hardware, such as by an application specific integrated circuit (ASIC) or FPGA, for example, or as a combination of hardware and software, such as by a microprocessor system and a set of instructions to implement the module's functionality, which (while being executed) transform the microprocessor system into a special-purpose device. A module may also be implemented as a combination of the two, with certain functions facilitated by hardware alone, and other functions facilitated by a combination of hardware and software. In certain implementations, at least a portion, and in some cases, all, of a module may be executed on the processor of a computer system. Accordingly, each module may be realized in a variety of suitable configurations, and should not be limited to any particular implementation exemplified herein.

In the interest of clarity, not all of the routine features of the aspects are disclosed herein. It would be appreciated that in the development of any actual implementation of the present disclosure, numerous implementation-specific decisions must be made in order to achieve the developer's specific goals, and these specific goals will vary for different implementations and different developers. It is understood that such a development effort might be complex and time-consuming, but would nevertheless be a routine undertaking of engineering for those of ordinary skill in the art, having the benefit of this disclosure.

Furthermore, it is to be understood that the phraseology or terminology used herein is for the purpose of description and not of restriction, such that the terminology or phraseology of the present specification is to be interpreted by the skilled in the art in light of the teachings and guidance presented herein, in combination with the knowledge of those skilled in the relevant art(s). Moreover, it is not intended for any term in the specification or claims to be ascribed an uncommon or special meaning unless explicitly set forth as such.

The various aspects disclosed herein encompass present and future known equivalents to the known modules referred to herein by way of illustration. Moreover, while aspects and applications have been shown and described, it would be apparent to those skilled in the art having the benefit of this disclosure that many more modifications than mentioned above are possible without departing from the inventive concepts disclosed herein.

The invention claimed is:

1. A biosensing system for a virtual reality (VR) headset, the biosensing system comprising:

a front system portion suitable for housing a VR display and/or a computer system for generating audiovisual content and/or haptic feedback for output on the VR display and headphones;

an outer-facing lens with an integrated front vent;

a venting architecture within the front system portion comprising a pair of vertically stacked airflow channels that extend from a lower plenum to the front vent, wherein the lower plenum is proximate to heat-generating electronics comprising at least the VR display; and a forward-facing thermally conductive member that forms at least part of an exterior enclosure of the front system portion and is thermally coupled to the heat-generating electronics and exposed to airflow within the stacked airflow channels, wherein the venting architecture is configured to guide heated air from the lower plenum through the airflow channels to the front vent to dissipate heat.

2. The biosensing system of claim 1, wherein the forward-facing thermally conductive member is made of copper.

3. The biosensing system of claim 1, wherein the forward-facing thermally conductive member includes interior heat-exchange features that increase effective surface area for convective transfer to air flowing within the airflow channels, wherein the features include one or more of fins, ribs, and micro-texturing.

4. The biosensing system of claim 1, wherein each of the airflow channels includes a converging inlet transitioning to a constant cross-section sized to balance pressure drop and acoustic transparency under fanless operation.

5. The biosensing system of claim 1, wherein the lower plenum is defined by a bent sheet-metal frame and one or more internal baffles that partition intake regions from internal components to establish a pressure boundary and inhibit lateral leakage into the front system portion.

6. The biosensing system of claim 1, further comprising a separation wall between the airflow channels to form thermally decoupled passages configured such that each passage draws air from different regions comprising different heat-generating electronics.

7. The biosensing system of claim 1, further comprising side intake vents disposed outside a perimeter of a face mask of the front system portion and arranged to entrain ambient air along an underside of the front system portion and route the air around a nose-bridge region into the lower plenum.

8. The biosensing system of claim 7, wherein each side intake vent feeds a dedicated lower manifold aligned with a corresponding one of the airflow channels, the dedicated lower manifold including one or more flow straighteners upstream of an entrance to the corresponding airflow channel.

9. The biosensing system of claim 1, wherein the front vent has a grille pattern having an open-area ratio selected to minimize exit losses, and louvers oriented to reduce stray light ingress and shield internal surfaces from dust accumulation.

10. The biosensing system of claim 1, wherein the venting architecture supports passive natural convection and is further compatible with optional low-profile microblowers without altering an external appearance of the front vent.

11. A method for dissipating heat in a virtual reality (VR) headset, the method comprising:

integrating an outer-facing lens with a front vent into a front system portion of the VR headset;

defining within the front system portion a venting architecture comprising a pair of vertically stacked airflow channels extending from a lower plenum to the front vent, wherein the lower plenum is proximate to heat-generating electronics comprising at least a VR display;

thermally coupling a forward-facing thermally conductive member that forms at least part of an exterior enclosure of the front system portion to the heat-generating electronics and exposing the forward-facing thermally conductive member to airflow within the stacked airflow channels; and guiding heated air from the lower plenum through the stacked airflow channels to the front vent to dissipate heat.

12. The method of claim 11, wherein the forward-facing thermally conductive member is made of copper.

13. The method of claim 11, further comprising forming interior heat-exchange features on the forward-facing thermally conductive member to increase effective surface area for convective transfer to air flowing within the airflow channels, wherein the interior heat-exchange features include one or more of fins, ribs, and micro-texturing.

14. The method of claim 11, further comprising shaping each of the airflow channels with a converging inlet transitioning to a constant cross-section sized to balance pressure drop and acoustic transparency under fanless operation.

15. The method of claim 11, further comprising defining the lower plenum with a bent sheet-metal frame and one or more internal baffles that partition intake regions from internal components to establish a pressure boundary and inhibit lateral leakage into the front system portion.

16. The method of claim 11, further comprising providing a separation wall between the airflow channels to form thermally decoupled passages configured such that each passage draws air from different regions comprising different heat-generating electronics.

17. The method of claim 11, further comprising disposing side intake vents outside a perimeter of a face mask of the front system portion and arranging the side intake vents to entrain ambient air along an underside of the front system portion and route the ambient air around a nose-bridge region into the lower plenum.

18. The method of claim 17, further comprising feeding each side intake vent into a dedicated lower manifold aligned with a corresponding one of the airflow channels and incorporating one or more flow straighteners in the dedicated lower manifold upstream of an entrance to the corresponding airflow channel.

19. The method of claim 11, further comprising configuring the front vent with a grille pattern having an open-area ratio selected to minimize exit losses and orienting louvers of the grille pattern to reduce stray light ingress and shield internal surfaces from dust accumulation.

20. The method of claim 11, further comprising operating the venting architecture in passive natural convection and supplementing airflow with low-profile microblowers.

* * * * *